(12) United States Patent
Choi et al.

(10) Patent No.: US 11,797,405 B2
(45) Date of Patent: *Oct. 24, 2023

(54) NONVOLATILE MEMORY DEVICE HAVING CELL-OVER-PERIPHERY (COP) STRUCTURE WITH ADDRESS RE-MAPPING

(71) Applicant: Samsung Electronics Co., Ltd., Suwon-si (KR)

(72) Inventors: Yonghyuk Choi, Suwon-si (KR); Sangwan Nam, Hwaseong-si (KR); Jaeduk Yu, Seoul (KR); Sangwon Park, Seoul (KR); Bongsoon Lim, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/935,502

(22) Filed: Sep. 26, 2022

(65) Prior Publication Data
US 2023/0013747 A1    Jan. 19, 2023

Related U.S. Application Data

(63) Continuation of application No. 16/865,948, filed on May 4, 2020, now Pat. No. 11,467,932.

(30) Foreign Application Priority Data

Sep. 27, 2019  (KR) ........................ 10-2019-0119935

(51) Int. Cl.
*G11C 16/10*    (2006.01)
*G06F 11/20*    (2006.01)
(Continued)

(52) U.S. Cl.
CPC ...... *G06F 11/2094* (2013.01); *G11C 16/0483* (2013.01); *G11C 16/08* (2013.01);
(Continued)

(58) Field of Classification Search
CPC ............ G06F 11/2094; G06F 2201/85; G06F 11/1048; G06F 12/0882; G06F 12/0246;
(Continued)

(56) References Cited

U.S. PATENT DOCUMENTS 7,916,540 B2    3/2011  Byeon
8,954,653 B1    2/2015  Lo et al.
(Continued)

FOREIGN PATENT DOCUMENTS

KR          100923989 B1    10/2009

*Primary Examiner* — Hien N Nguyen
(74) *Attorney, Agent, or Firm* — Myers Bigel, P.A.

(57) ABSTRACT

A nonvolatile memory device includes a first semiconductor layer, a second semiconductor layer and a control circuit. The memory cell array includes a first vertical structure on the first upper substrate and a second vertical structure on the second upper substrate, the first vertical structure includes first sub-blocks and the second vertical structure includes second sub-blocks. The second semiconductor layer includes a lower substrate that includes address decoders and page buffer circuits. The first vertical structure includes first via areas in which one or more through-hole vias are provided, through-hole vias pass through the first vertical structure. The first sub-blocks are arranged among the first via areas and the second sub-blocks are arranged among the second via areas. The control circuit groups the memory blocks into a plurality of groups based on whether the memory blocks is close to the first via areas and performs address re-mapping.

16 Claims, 26 Drawing Sheets

(51) Int. Cl.
　　　*G11C 16/04*　　　(2006.01)
　　　*G11C 16/08*　　　(2006.01)
　　　*H10B 41/27*　　　(2023.01)
　　　*H10B 43/27*　　　(2023.01)

(52) U.S. Cl.
　　　CPC .......... *G06F 2201/85* (2013.01); *H10B 41/27* (2023.02); *H10B 43/27* (2023.02)

(58) Field of Classification Search
　　　CPC ..... G11C 16/0483; G11C 16/08; G11C 5/063; G11C 16/10; H10B 41/27; H10B 43/27; H10B 41/50; H10B 43/50
　　　See application file for complete search history.

(56) References Cited

U.S. PATENT DOCUMENTS

| | | |
|---|---|---|
| 9,098,395 B2 | 8/2015 | Yeh |
| 9,659,666 B2 | 5/2017 | Yang et al. |
| 9,727,253 B2 | 8/2017 | Kong et al. |
| 11,467,932 B2 * | 10/2022 | Choi ..................... H10B 41/50 |
| 2008/0052446 A1 | 2/2008 | Lasser et al. |
| 2011/0228581 A1 | 9/2011 | Park et al. |
| 2014/0297921 A1 | 10/2014 | Yu-Tang |
| 2014/0359382 A1 | 12/2014 | Choi |
| 2015/0067248 A1 | 3/2015 | Yoo et al. |
| 2018/0307431 A1 | 10/2018 | Gunnam et al. |
| 2019/0066802 A1 | 2/2019 | Malshe et al. |
| 2019/0108090 A1 | 4/2019 | Shen et al. |
| 2020/0192814 A1 | 6/2020 | Hanna et al. |
| 2020/0210080 A1 | 7/2020 | Palmer et al. |
| 2021/0201982 A1 | 7/2021 | Choi et al. |

* cited by examiner

NONVOLATILE MEMORY DEVICE HAVING CELL-OVER-PERIPHERY (COP) STRUCTURE WITH ADDRESS RE-MAPPING

REFERENCE TO RELATED APPLICATION

This U.S. patent application is a continuation of and claims priority from U.S. application Ser. No. 16/865,948, now U.S. Pat. No. 11,467,932, filed May 4, 2020, which claims priority under 35 USC § 119 to Korean Patent Application No. 10-2019-0119935, filed Sep. 27, 2019, in the Korean Intellectual Property Office (KIPO), the disclosure of which is hereby incorporated herein by reference.

BACKGROUND

1. Technical Field

Exemplary embodiments relate generally to memory devices, and more particularly to nonvolatile memory devices

2. Discussion of the Related Art

Semiconductor memory devices may be volatile or non-volatile. Flash memory devices are typically nonvolatile semiconductor memory devices. Flash memory devices may be used as a voice and image data storing medium for information appliances, such as computers, cellular phones, PDAs, digital cameras, handheld PCs, and the like.

Recently, nonvolatile memory devices having memory cells that are stacked in three dimensions have been researched to improve integration of the nonvolatile memory devices. As information communication devices are being developed to have multitudes of functions, memories for such devices require a large capacity and a high degree of integration. As memory cell sizes decrease to achieve high integration, the complexity of the structures of operation circuits and/or wirings included in the memory devices can degrade the memory cell electrical characteristics. Accordingly, there exists a demand for memory devices having a high degree of integration and excellent electrical characteristics.

SUMMARY

A nonvolatile memory device according to an embodiment of the invention includes a lower substrate having address decoder and page buffer circuitry therein, and first and second upper substrates on the lower substrate. These upper and lower substrates may be formed as semiconductor substrates. A memory cell array is also provided, which includes a first vertical structure on the first upper substrate. This first vertical structure has a plurality of first memory sub-blocks therein and a first plurality of through-hole vias extending at least partially therethrough. A second vertical structure is also provided, which extends on the second upper substrate. This second vertical structure has a plurality of second memory sub-blocks therein and a second plurality of through-hole vias extending at least partially therethrough. Advantageously, a control circuit is provided, which is configured to group the first memory sub-blocks into a plurality of groups of memory sub-blocks according to their closeness to the first plurality of through-hole vias. This control circuit is further configured to perform address re-mapping by replacing a defective one of the first memory sub-blocks with a non-defective one of the first memory sub-blocks, subject to a constraint that the non-defective one of the first memory sub-blocks is selected as a replacement based on its inclusion in the same group of memory blocks as the defective one of the first memory sub-blocks.

According to further embodiments, the control circuit is also configured to control the address decoder and page buffer circuitry within the lower substrate, in response to a command and address received by the nonvolatile memory device. In addition, the control circuit may include a register, which is configured to store boundary address information associated with the first plurality of through-hole vias, and a group information generator, which is configured to generate group address information indicating a group to which the first memory sub-block associated with the address belongs to, based on the address and the boundary address information. The control circuit also includes an address re-mapper, which is configured to generate a first re-mapped address to access the non-defective one of the first memory sub-blocks by re-mapping an address associated with the defective one of the first memory sub-blocks, based on the group address information.

According to further embodiments, the first and second vertical structures have a plurality of bit lines thereon and a plurality of word lines therein. In addition, at least some of the first plurality of through-hole vias electrically connect at least some of the bit lines to portions of the page buffer circuitry, whereas other ones of the first plurality of through-hole vias electrically connect at least some of the word lines to portions of the address decoder circuitry.

According to further embodiments, a nonvolatile memory device is provided, which includes a first semiconductor substrate having a memory cell array thereon. This memory cell array includes a first vertical structure, and this first vertical structure includes a plurality of first memory sub-blocks therein, and a first plurality of through-hole vias extending at least partially therethrough. A control circuit is also provided, which is configured to: (i) group the first memory sub-blocks into a plurality of groups of memory sub-blocks according to their threshold voltage characteristics, which are a function of their relative physical location within the first vertical structure, and (ii) perform address re-mapping by replacing a defective one of the first memory sub-blocks with a non-defective one of the first memory sub-blocks, subject to a constraint that the non-defective one of the first memory sub-blocks is selected as a replacement based on its inclusion in the same group of memory blocks as the defective one of the first memory sub-blocks. According to these embodiments, the memory device may be configured to have a cell-over-periphery (COP) structure, which includes a second semiconductor layer having address decoder and page buffer circuitry therein. An interface between the second semiconductor layer and the first semiconductor substrate may be provided, which extends between the address decoder (and page buffer circuitry) and the memory cell array.

According to additional embodiments, a nonvolatile memory device includes a first semiconductor layer, a second semiconductor layer and a control circuit. The first semiconductor layer includes a plurality of word-lines extending in a first direction, a plurality of bit-lines extending in a second direction, first and second upper substrates adjacent to each other in the first direction and a memory cell array. The memory cell array includes a first vertical structure on the first upper substrate and a second vertical structure on the second upper substrate, the first vertical structure includes a plurality of first sub-blocks and the second vertical structure includes a plurality of second sub-blocks corresponding to the first sub-blocks. The second semiconductor layer is under the first semiconductor layer in a third direction perpendicular to the first and second directions, the second semiconductor layer includes a lower substrate that includes a plurality of address decoders and a plurality of page buffer circuits which control the memory cell array. The control circuit controls the address decoders and the page buffer circuits based on a command and an address from external the memory device. The first vertical structure includes first via areas in which one or more through-hole vias are provided and the first via areas are spaced apart in the second direction. The one or more through-hole vias pass through the first vertical structure. The second vertical structure includes second via areas corresponding to the first via areas. The first sub-blocks are arranged among the first via areas and the second sub-blocks are arranged among the second via areas. The first sub-blocks and the second sub-blocks constitute memory blocks. The control circuit is configured to group the memory blocks into a plurality of groups based on whether the memory blocks are close to the first via areas and performs address re-mapping such that at least one sub-block of a second memory block in a first group is selected in response to a defect occurring in a first memory block in a first group of the plurality of groups.

According to exemplary embodiments, a nonvolatile memory device includes a first semiconductor layer, a second semiconductor layer and a control circuit. The first semiconductor layer includes a plurality of word-lines extending in a first direction, a plurality of bit-lines extending in a second direction, first and second upper substrates adjacent to each other in the first direction and a memory cell array. The memory cell array includes a first vertical structure on the first upper substrate and a second vertical structure on the second upper substrate. The first vertical structure includes a plurality of first sub-blocks and the second vertical structure includes a plurality of second sub-blocks corresponding to the first sub-blocks. The second semiconductor layer is under the first semiconductor layer in a third direction perpendicular to the first and second directions. The second semiconductor layer includes a lower substrate having a plurality of address decoders and a plurality of page buffer circuits therein, which control the memory cell array. The control circuit controls the address decoders and the page buffer circuits based on an external command and an address. The first vertical structure includes first via areas in which one or more through-hole vias are provided, and first and second edge via areas adjacent to edges in the second direction and in the first sub-blocks, and the one or more through-hole vias pass through the first vertical structure. The second vertical structure includes second via areas corresponding to the first via areas, a third edge via area corresponding to the first edge via area and a fourth edge via area corresponding to the second edge via area. The first sub-blocks are arranged among the first edge via area, the second edge via area and the first via areas. The second sub-blocks are arranged among third edge via area, the fourth edge via area and the second via areas. The first sub-blocks and the second sub-blocks constitute corresponding memory blocks. The control circuit groups the memory blocks into a plurality of groups based on a distance from the first edge via area and performs address re-mapping such that at least one sub-block of a second memory block in a first group is selected in response to a defect occurring in a first memory block in a first group of the plurality of groups having.

According to exemplary embodiments, a nonvolatile memory device includes a first semiconductor layer, a second semiconductor layer, a common source line plate, and a control circuit. The first semiconductor layer includes a plurality of word-lines extending in a first direction, a plurality of bit-lines extending in a second direction, first and second upper substrates adjacent to each other in the first direction and a memory cell array. The memory cell array includes a first vertical structure on the first upper substrate and a second vertical structure on the second upper substrate, the first vertical structure includes a plurality of first sub-blocks and the second vertical structure includes a plurality of second sub-blocks corresponding to the first sub-blocks. The second semiconductor layer is under the first semiconductor layer in a third direction perpendicular to the first and second directions. The second semiconductor layer includes a lower substrate having a plurality of address decoders and a plurality of page buffer circuits therein, which control the memory cell array. The common source line plate is interposed between the first semiconductor layer and the semiconductor layer. The control circuit controls the address decoders and the page buffer circuits based on an external command and an address. The first vertical structure includes first via areas in which one or more through-hole vias are provided and the first via areas are spaced apart in the second direction. The one or more through-hole vias pass through the first vertical structure. The second vertical structure includes second via areas corresponding to the first via areas. The first sub-blocks are arranged among the first via areas serving as boundaries and the second sub-blocks are arranged among the second via areas serving as boundaries. The first sub-blocks and the second sub-blocks constitute memory blocks. The control circuit groups the memory blocks into a plurality of groups based on the first via areas and performs address re-mapping such that at least one sub-block of a second memory block in a first group is selected in response to a defect occurring in a first memory block in a first group of the plurality of groups.

Accordingly, the nonvolatile memory device having a cell-over-periphery (COP) structure, groups a plurality of memory blocks into a plurality of groups based on physical/electrical characteristic and perform address re-mapping such that a memory block having a defect in one groups is replaced with at least one sub-block a different memory block in the same group. Therefore, the nonvolatile memory device may reduce chip size while maintaining performance.

BRIEF DESCRIPTION OF THE DRAWINGS

Illustrative, non-limiting exemplary embodiments will be more clearly understood from the following detailed description in conjunction with the accompanying drawings.

DETAILED DESCRIPTION

Figure 1:
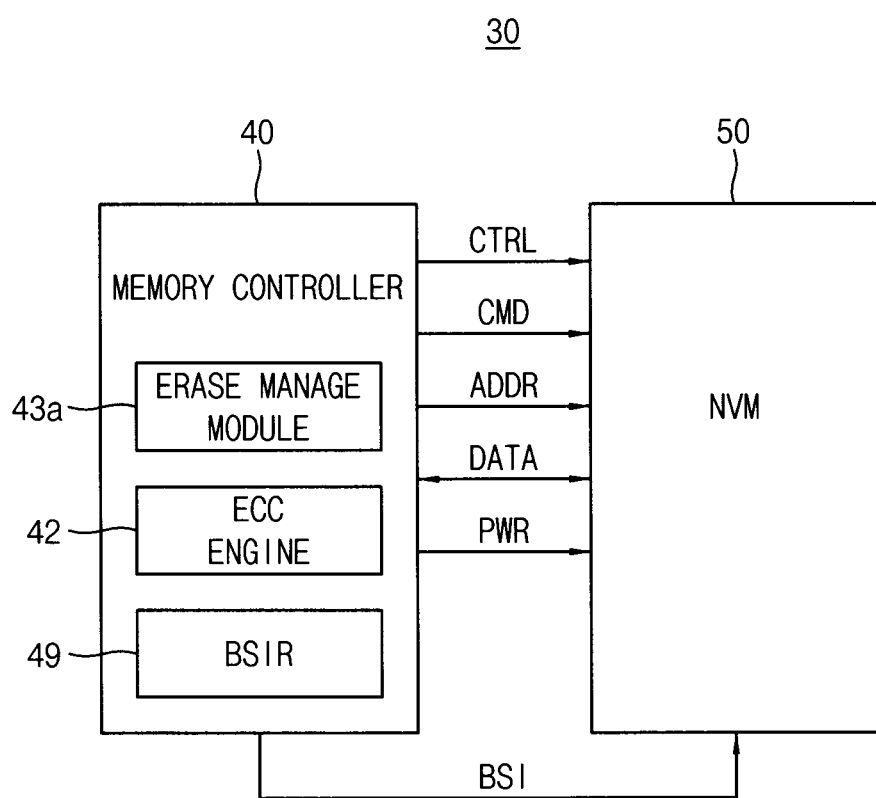
FIG. 1 is a block diagram illustrating a storage device according to exemplary embodiments.

Various exemplary embodiments will be described more fully hereinafter with reference to the accompanying drawings, in which some exemplary embodiments are shown.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated device.

FIG. 1 is a block diagram illustrating a storage device according to exemplary embodiments. Referring to FIG. 1, a storage device (or a memory system) 30 may include a memory controller 40 and a nonvolatile memory device 50. In exemplary embodiments, each of the memory controller 40 and the nonvolatile memory device 50 may be provided in the form of a chip, a package, or a module. Alternatively, the memory controller 40 and the nonvolatile memory device 50 may be mounted on various packages to be provided as a storage device such as a memory card.

The nonvolatile memory device 50 may perform a read operation, an erase operation, and a program operation or a write operation under control of the memory controller 40. The nonvolatile memory device 50 receives a command CMD, an address ADDR and data DATA through input/output lines from the memory controller 40 for performing such operations. In addition, the nonvolatile memory device 50 receives a control signal CTRL through a control line from the memory controller 40. In addition, the nonvolatile memory device 50 receives a power PWR through a power line from the memory controller 40.

Memory cells of the nonvolatile memory device 50 may have the physical characteristic that a threshold voltage distribution varies due to causes, such as a program elapsed time, a temperature, program disturbance, read disturbance, etc. And, data stored at the nonvolatile memory device 50 may become erroneous due to the above causes. The memory controller 40 utilizes a variety of error correction techniques to correct such errors. For example, the memory controller 40 may include an error correction code (ECC) engine 42.

The memory controller 40 may perform an erase operation on the nonvolatile memory device 50 by sub-block unit and the sub-block is smaller than one memory block of the nonvolatile memory device 50. As an example, one memory block may include a plurality of sub-blocks. The memory controller 40 may include an erase manage module 43a to manage the erase operation by sub-block unit.

After a sub-block erase operation, the erase manage module 43a may check an erase status of an erased sub-block and/or a sub-block adjacent to the erased sub-block. For example, the erase manage module 43a may sense memory cells of the erased sub-block to determine whether specific parameters exceed a reference value. The erase manage module 43a may read data of sub-block(s) adjacent to the erased sub-block to detect erase-inhibition efficiency. For example, the erase manage module 43*a* may detect bit error rate (BER) based on data read from an erased sub-block. The erase manage module 43*a* may acquire and monitor wear-leveling information (e.g., erase count) on the erased sub-block. In addition, the erase manage module 43*a* may read data of the erased sub-block to monitor a variation in threshold voltages of selected memory cells and/or a variation in the bit error rate (BER). The erase manage module 43*a* may also read data of an unselected sub-block to detect a variation in a threshold voltage. The memory controller 40 may perform various procedures for compensating for insufficient erasing of a selected sub-block based on erase status information detected by the erase manage module 43*a*.

Generally, a memory block is the maximum memory unit that may be erased at the same time. In a three-dimensional nonvolatile memory device, where word-lines are stacked in a direction intersecting (e.g., perpendicular to) a substrate, a memory block may be defined as a group of cell strings sharing all stacked word-lines. A sub-block corresponds to a sub-memory unit defined by dividing the memory block (or, physical block) by word line unit or selection line unit. For example, each sub-block may be formed of memory cells sharing a portion of the word-lines of the memory block.

During a read operation on the nonvolatile memory device 50, the memory controller 40 may read data stored at a first page of the nonvolatile memory device 50, using a default read voltage set. The default read voltage set may include predetermined read voltages. The ECC engine 42 may detect and correct errors included in data read from the nonvolatile memory device 50. The ECC engine 42 may perform an ECC operation by detecting and correcting errors. In exemplary embodiments, the ECC engine 42 may be implemented in the form of hardware. The ECC engine 42 may determine error occurrence frequency in the read data from the nonvolatile memory device 50 by unit of sub-block and may designate a sub-block as a bad sub-block, whose error occurrence frequency is greater than a reference value during a predetermined time.

The memory controller 40 may include a bad sub-block information register 49 that stores information of at least one bad sub-blocks of the sub-blocks and may provide the nonvolatile memory device 50 with bad sub-block information BSI including bad sub-block addresses of the bad sub-block.

Figure 2:
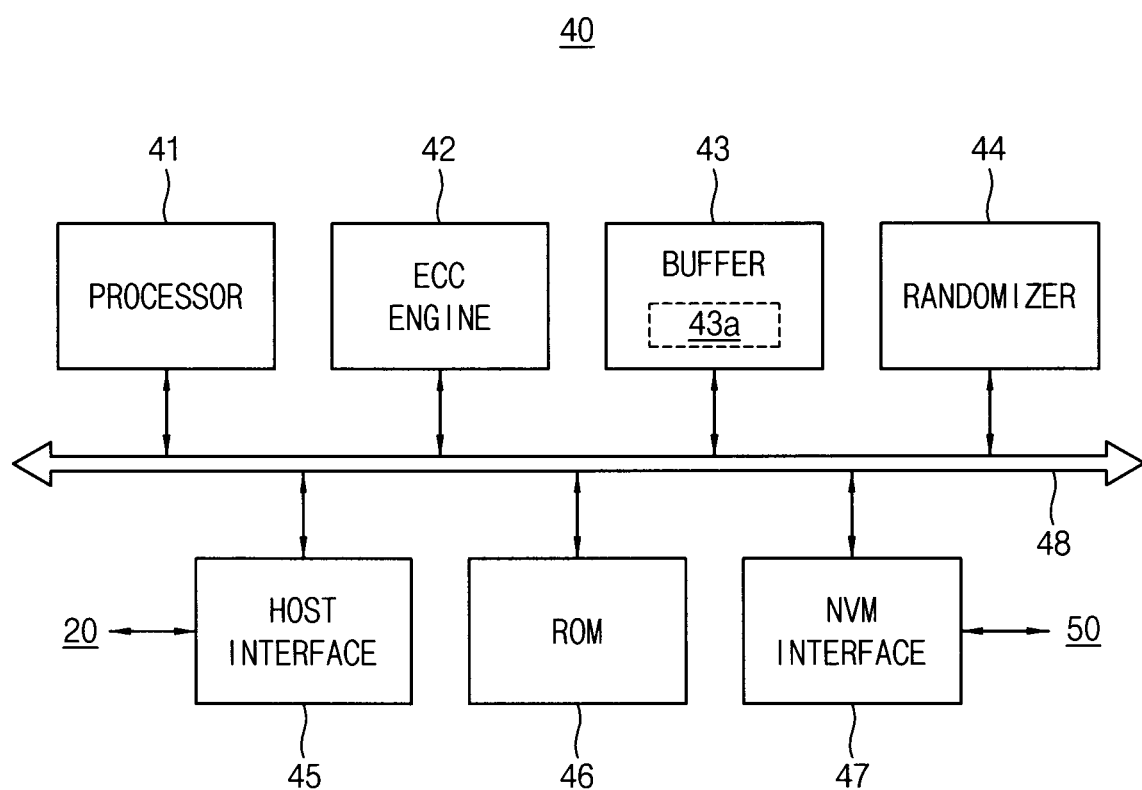
FIG. 2 is a block diagram illustrating an example of the memory controller in the storage device of FIG. 1 according to exemplary embodiments.

FIG. 2 is a block diagram illustrating an example of the memory controller in the storage device of FIG. 1 according to exemplary embodiments. Referring to FIGS. 1 and 2, the memory controller 40 may include a processor 41, the ECC engine 42, the buffer 43, the erase manage module 43*a*, a randomizer 44, a host interface 45, a read only memory (ROM) 46 and a nonvolatile memory interface 47 which are connected via a bus 48. The ECC engine 42, and the erase manage module 43*a* are described with reference to FIG. 1, and a description thereof is thus omitted.

The processor 41 controls an overall operation of the memory controller 40. In exemplary embodiments, the erase manage module 43*a* may be implemented in software and stored in the buffer 43. The erase manage module 43*a* stored in the buffer 43 may be driven by the processor 41. The ROM 46 stores a variety of information, needed for the memory controller 40 to operate, in firmware. The buffer 43 may store data provided from the nonvolatile memory device 50 and may include the erase manage module 43*a*.

The randomizer 44 randomizes data to be stored in the nonvolatile memory device 50. For example, the randomizer 44 may randomize data to be stored in the nonvolatile memory device 50 in a unit of a word-line.

Data randomizing is to process data such that program states of memory cells connected to a word-line have the same ratio. For example, if memory cells connected to one word-line are multi-level cells (MLC) each storing 2-bit data, each of the memory cells has one of an erase state and first through third program states. In this case, the randomizer 44 randomizes data such that in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored have program states of which the number is equal to one another. The randomizer 44 de-randomizes data read from the nonvolatile memory device 50.

The memory controller 40 communicates with an external host through the host interface 45. For example, the host interface 45 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 40 communicates with the nonvolatile memory device 50 through the nonvolatile memory interface 47.

Figure 3:
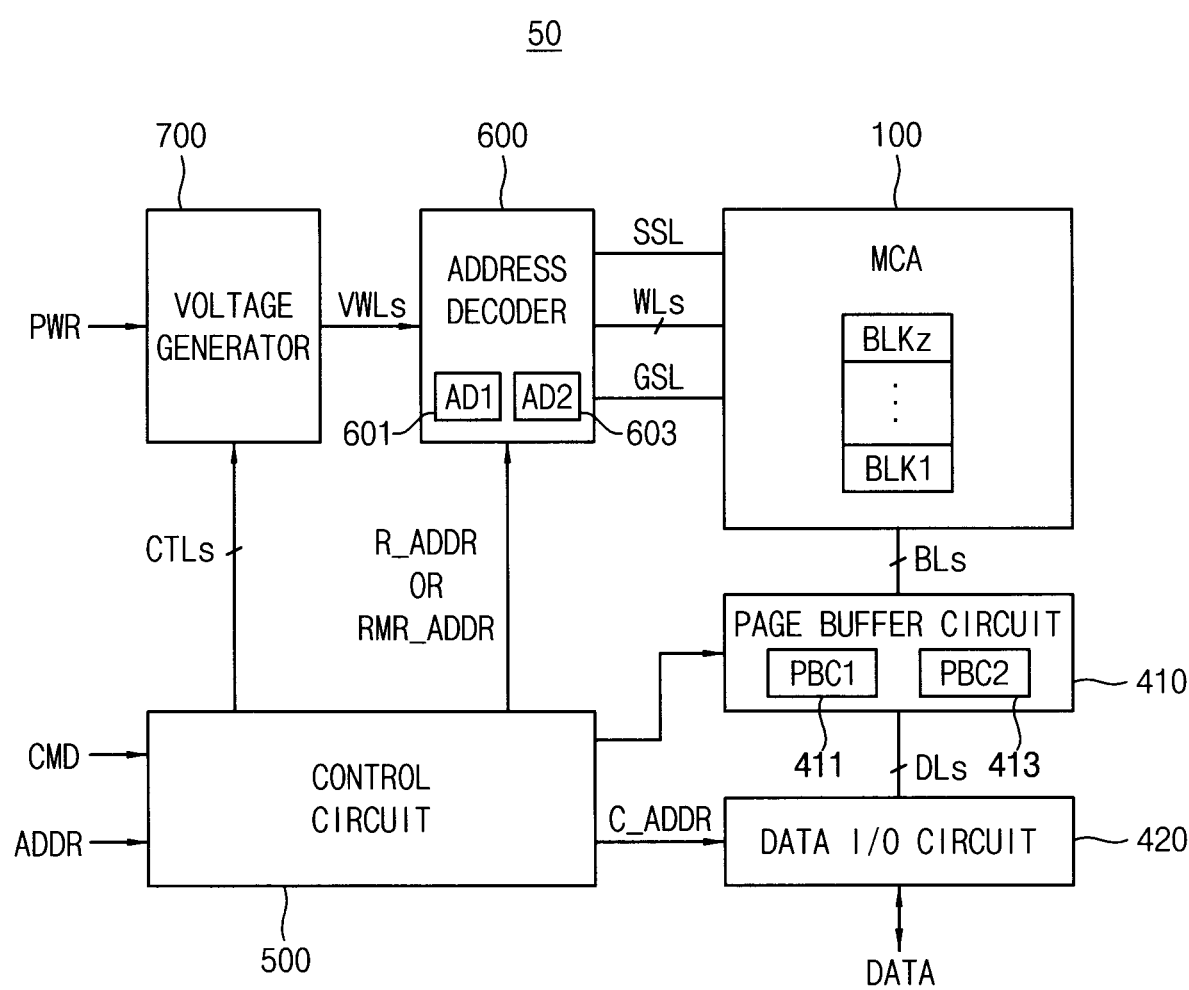
FIG. 3 is a block diagram illustrating an example of the nonvolatile memory device in the storage device of FIG. 1 according to exemplary embodiments.

FIG. 3 is a block diagram illustrating an example of the nonvolatile memory device in the storage device of FIG. 1 according to exemplary embodiments. Referring to FIG. 3, the nonvolatile memory device 50 includes a memory cell array 100, an address decoder 600, a page buffer circuit 410, a data input/output (I/O) circuit 420, a control circuit 500 and a voltage generator 700. The memory cell array 100 may be coupled to the address decoder 600 through a string selection line SSL, a plurality of word-lines WLs, and a ground selection line GSL. In addition, the memory cell array 100 may be coupled to the page buffer circuit 410 through a plurality of bit-lines BLs. The memory cell array 100 may include a plurality of memory cells coupled to the plurality of word-lines WLs and the plurality of bit-lines BLs.

The memory cell array 100 may include a plurality of memory blocks BLK1 through BLKz, and each memory block may have a planar structure or a three-dimensional (3D) structure. The memory cell array 100 may include a single-level cell block including single-level cells (SLC), a multi-level cell block including multi-level cells (MLC), a triple-level cell block including triple-level cells (TLC), or a quad-level cell block including quad-level cells (QLC). For example, some memory blocks from among the memory blocks BLK1 through BLKz may be single-level cell blocks, and other memory blocks may be multi-level cell blocks, triple-level cell blocks, or quad-level cell blocks.

In exemplary embodiments, the memory cell array 100 may include first and second vertical structures located on different upper substrates. For example, the first vertical structure may include one or more first via areas and a plurality of first sub-blocks and the second vertical structure may include one or more second via areas and a plurality of second sub-blocks. For example, in the first via area, one or more first through-hole vias and a first edge through-hole via which pass through the first vertical structure and are connected to at least some of page buffers are formed. In addition, in the second via area, one or more through-hole vias and a second edge through-hole via which pass through the second vertical structure and are connected to at least some of page buffers are formed.

The control circuit 500 may group the memory blocks, each including a first sub-block and a second sub-block, into a plurality of groups based on one of whether the memory blocks are close to a via area, a distance from the edge through-hole via and via areas, and may perform address re-mapping such that at least one sub-block of a second memory block in a first group is selected in response to a defect occurring in a first memory block in a first group of the plurality of groups. That is, the control circuit 500 may perform the address re-mapping such that the defective first memory block is replaced with at least one sub-block of the second memory block if the defect occurs in the first memory block.

The control circuit 500 may receive the command (signal) CMD and the address (signal) ADDR from the memory controller 40 and control an erase operation, a program operation and a read operation of the nonvolatile memory device 50 based on the command signal CMD and the address signal ADDR.

In example embodiments, the control circuit 500 may generate the control signals CTLs, which are used for controlling the voltage generator 700 based on the command signal CMD, and generate a row address R_ADDR and a column address C_ADDR based on the address signal ADDR. The control circuit 500 may provide the row address R_ADDR to the address decoder 600 and provide the column address C_ADDR to the data input/output circuit 420.

The address decoder 600 may transfer voltages to the string selection line SSL, the plurality of word-lines WLs, and the ground selection line GSL for operating memory cells of the memory cell array 100 in response to an address ADDR and a command CMD received from the memory controller 40 by receiving various voltages VWLs from the voltage generator 700. The voltage generator 700 may provide the word-line voltages VWLs to the address decoder 600 to the memory cell array 100 in response to control signals CTLs received from the control circuit 500. The address decoder 600 may include a first address decoder 601 and a second address decoder 603.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines. In addition, during the read operation, the voltage generator 700 may apply a read voltage to the selected word-line and may apply a read pass voltage to the unselected word-lines.

The page buffer circuit 410 may be coupled to the memory cell array 100 through the plurality of bit-lines BLs. The page buffer circuit 410 may include a plurality of page buffers. The page buffer circuit 410 may temporarily store data to be programmed in a selected page or data read out from the selected page of the memory cell array 100. The page buffer circuit 410 may include a plurality of page buffers. The page buffer circuit 410 may temporarily store data to be programmed in a selected page and may temporarily store data read from the selected page. The page buffer circuit 410 may include a first page buffer circuit 411 and a second page buffer circuit 413.

The data input/output circuit 420 may be coupled to the page buffer circuit 410 through data lines DLs. During the program operation, the data input/output circuit 420 may receive program data DATA from the memory controller 40 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 40 based on the column address C_ADDR received from the control circuit 500.

Figure 4:
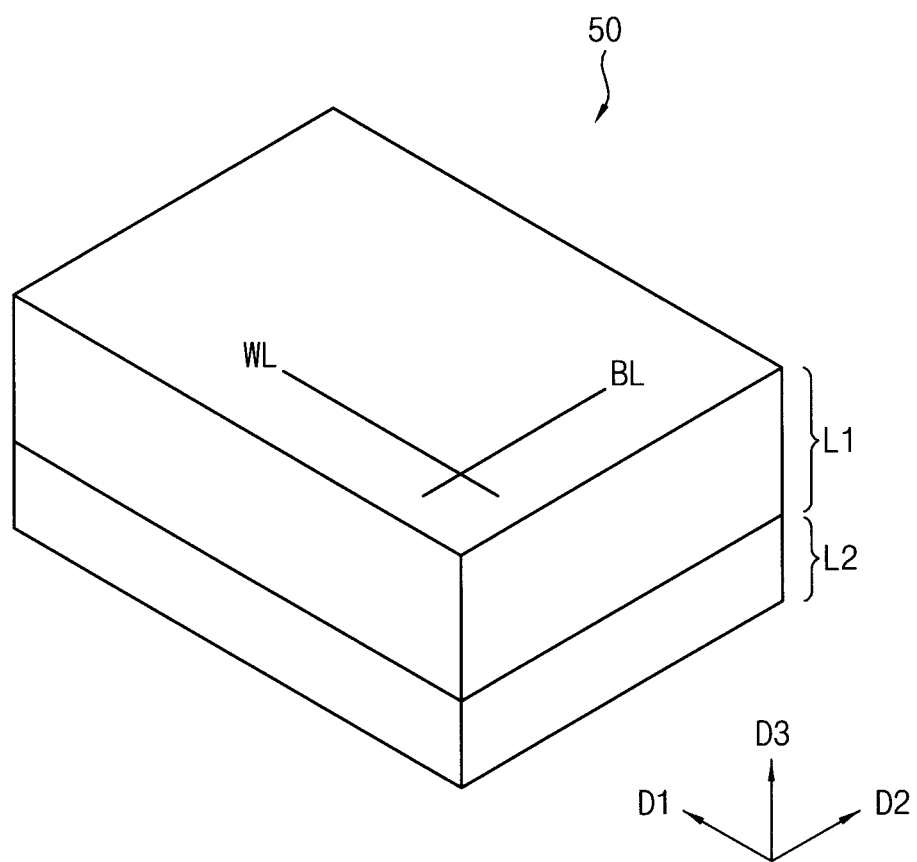
FIG. 4 is a view illustrating a structure of a nonvolatile memory device of FIG. 3 according to exemplary embodiments.

FIG. 4 is a view illustrating a structure of a nonvolatile memory device of FIG. 3 according to exemplary embodiments. Hereinafter, it is assumed that D1 denotes a first direction, D2 denotes a second direction and D3 denotes a third direction. Referring to FIG. 4, the nonvolatile memory device 50 may include a first semiconductor layer L1 and a second semiconductor layer L2. The first semiconductor layer L1 may be stacked on the second semiconductor layer L2 in a third direction. In exemplary embodiments, the memory cell array 100 may be formed on the first semiconductor layer L1, and at least one from among the control circuit 500, the address decoder 600, and the page buffer circuit 410 may be formed on the second semiconductor layer L2. For example, various circuits may be formed on the second semiconductor layer L2 by forming semiconductor elements such as transistors and patterns for wiring the semiconductor elements on a lower substrate of the second semiconductor layer L2.

After the circuits are formed on the second semiconductor layer L2, the first semiconductor layer L1 including the memory cell array 100 may be formed. For example, the first semiconductor layer L1 may include a plurality of upper substrates. The memory cell array 100 may be formed on the first semiconductor layer L1 by forming a plurality of gate conductive layers stacked on each of the upper substrates and a plurality of pillars that pass through the plurality of gate conductive layers and extend in a vertical direction (e.g., the third direction) perpendicular to a top surface of each of the upper substrates. In addition, patterns for electrically connecting the memory cell array 100 (e.g., the word-lines WL and the bit-lines BL) and the circuits formed on the second semiconductor layer L2 may be formed on the first semiconductor layer L1. For example, the word-lines WL may extend in a first direction and may be arranged in a second direction. In addition, the bit-lines BL may extend in the second direction and may be arranged in the first direction.

Accordingly, the nonvolatile memory device 100 may have a cell-on-periphery or cell-over-periphery (COP) structure in which the control circuit 500, the address decoder 600, the page buffer circuit 410, or various other peripheral circuits and the memory cell array 100 are arranged in a stacked direction (e.g., the third direction).

Figure 5:
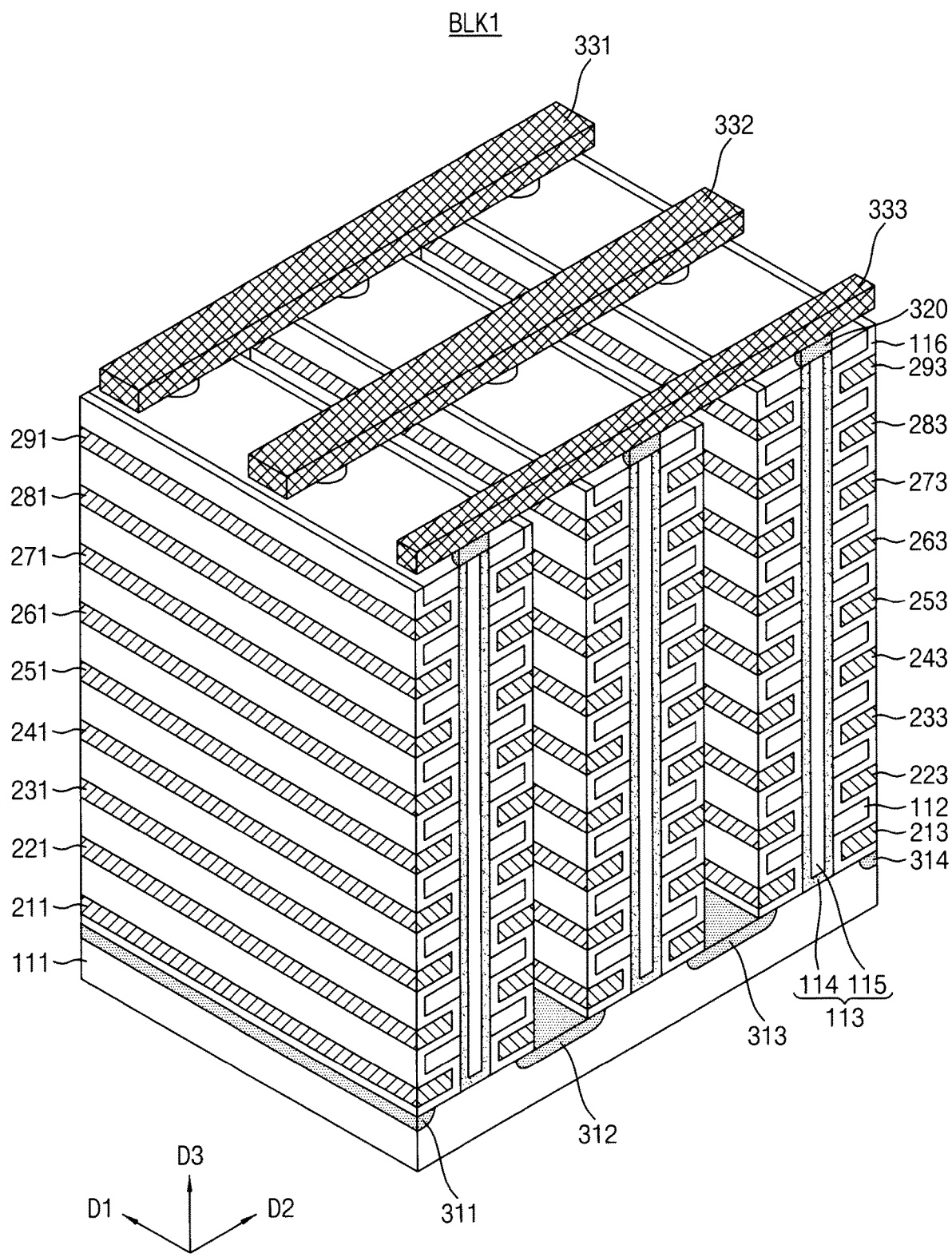
FIG. 5 is a perspective view illustrating one of the memory blocks of FIG. 3 according to exemplary embodiments.

FIG. 5 is a perspective view illustrating one of the memory blocks of FIG. 3 according to exemplary embodiments. Referring to FIG. 5, a memory block BLK1 includes structures extending along the first to third directions D1-D3. A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the second direction D2 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. Exemplarily, the insulation materials 112 may include an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An inner material 115 of each pillar 113 includes an insulation material. For example, the inner material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. Exemplarily, the insulation layer 116 provided on the exposed surface in the third direction D3 of the last insulation material 112 may be removed.

A plurality of first conductive materials 211 to 291 is provided between second doping regions 311 and 312 on the exposed surfaces of the insulation layer 116. For example, the first conductive material 211 extending along the first direction D1 is provided between the substrate 111 and the insulation material 112 adjacent to the substrate 111.

A first conductive material extending along the second direction D2 is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the second direction D2 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the second direction D2, a plurality of pillars 113 disposed sequentially along the second direction D2 and penetrating the plurality of insulation materials 112 along the third direction D3, an insulation layer 116 provided on the exposed surfaces of the plurality of insulation materials 112 and the plurality of pillars 113, and a plurality of conductive materials 213 to 293 extending along the second direction D2.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the second direction D2, a plurality of pillars 113 disposed sequentially along the second direction D2 and penetrating the plurality of insulation materials 112 along the third direction D3, an insulation layer 116 provided on the exposed surfaces of the plurality of insulation materials 112 and the plurality of pillars 113, and a plurality of first conductive materials 213 to 293 extending along the second direction D2.

Drains 320 are provided on the plurality of pillars 113, respectively. On the drains, the second conductive materials 331 to 333 extending along the second direction D2 are provided. The second conductive materials 331 to 333 are disposed along the first direction D1, being spaced by a specific distance. The second conductive materials 331 to 333 are respectively connected to the drains 320 in a corresponding region. The drains 320 and the second conductive material 333 extending along the second direction D2 may be connected through each contact plug.

Figure 6:
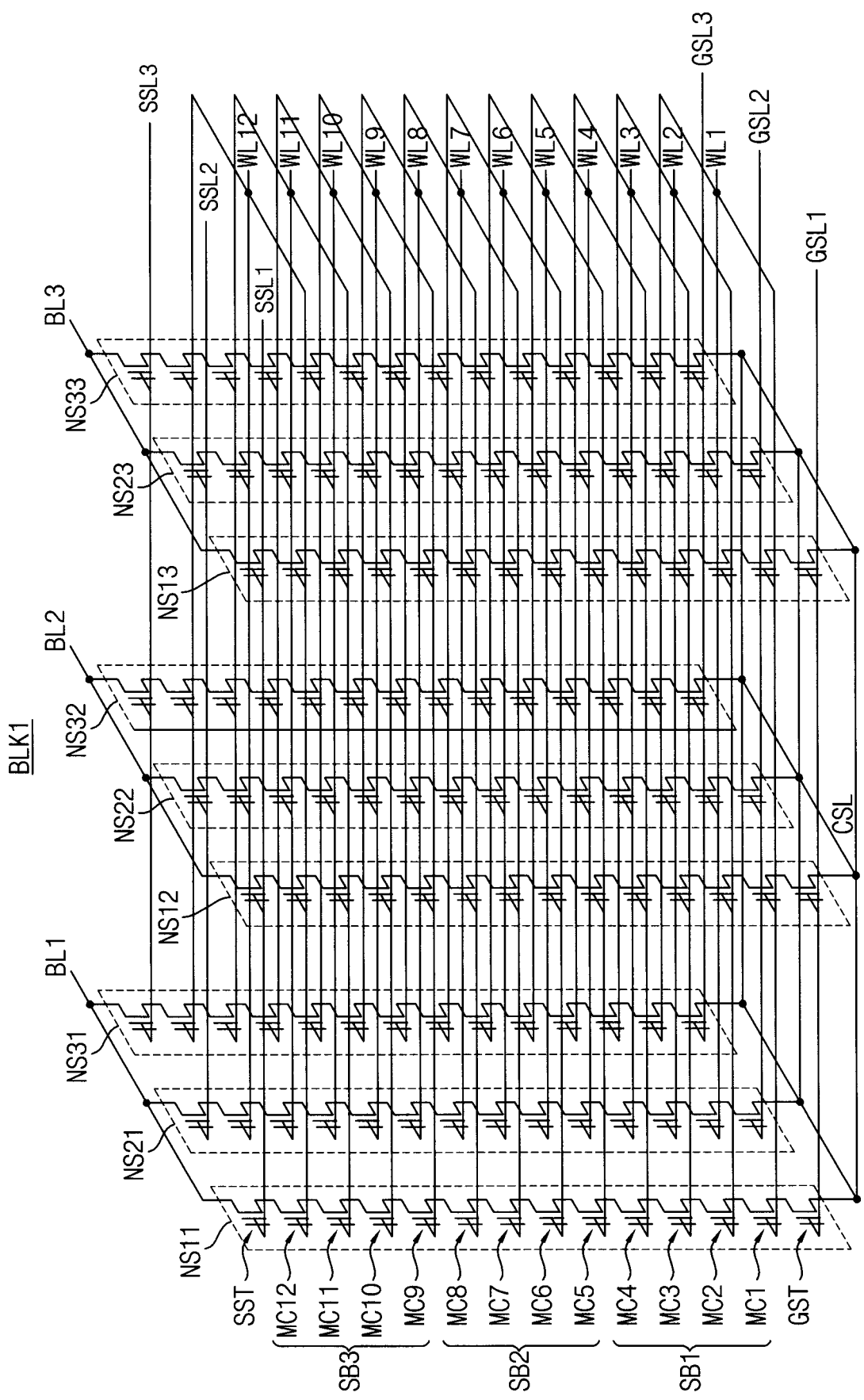
FIG. 6 is an equivalent circuit diagram illustrating the memory block of FIG. 5 according to exemplary embodiments.

FIG. 6 is an equivalent circuit diagram illustrating the memory block of FIG. 5 according to exemplary embodiments. The memory block BLK1 of FIG. 6 may be formed on a substrate in a three-dimensional structure (or a vertical structure). For example, a plurality of memory cell strings included in the memory block BLKi may be formed in a direction perpendicular to the substrate.

Figure 7:
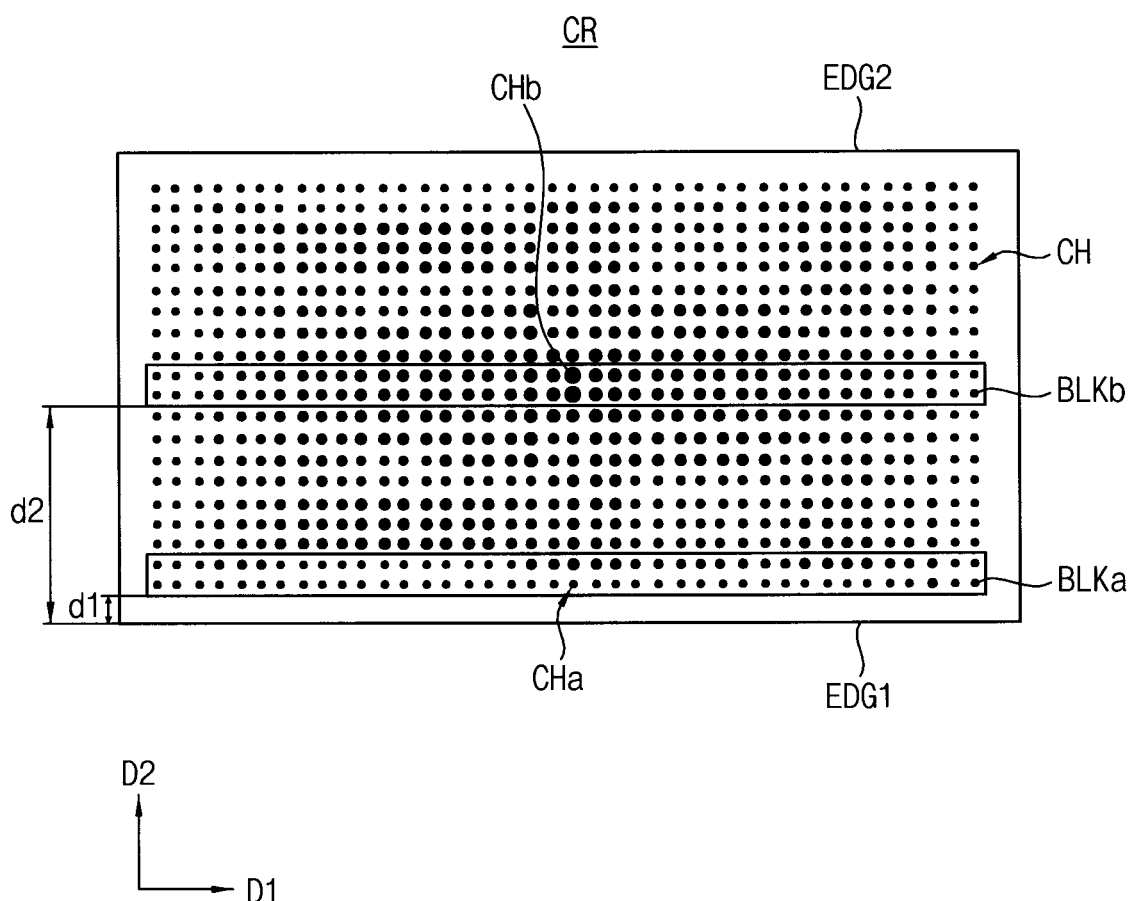
FIG. 7 illustrates a cell region in which the memory cell array of FIG. 3 is formed according to exemplary embodiments.

Referring to FIG. 6, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC12, and a ground selection transistor GST. In FIG. 7, each of the memory cell strings NS11 to NS33 is illustrated to include twelve memory cells MC1 to MC12. However, exemplary embodiments are not limited thereto. In some exemplary embodiments, each of the memory cell strings NS11 to NS33 may include any number of memory cells.

The string selection transistor SST may be connected to corresponding string selection lines SSL1 to SSL3. The plurality of memory cells MC1 to MC12 may be connected to corresponding word-lines WL1 to WL12, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

In example embodiments, dummy memory cells connected to a dummy word-line (not shown) may be coupled between the string selection transistor SST and the memory cell MC12 and/or coupled between the ground selection transistor GST and the memory cell MC1. For example, dummy memory cells may be simultaneously formed with normal memory cells with the same processes. A dummy memory cell may be activated by a dummy word-line, but may not have any "data" stored to read from a device external. For instance, data stored in a dummy memory cell electrically connected to a dummy word-line may not be transmitted outside of the memory cell array through selection signals provided by the column decoder, as is the case for normal memory cells. For instance, a dummy memory cell electrically connected to a dummy word-line may not have any connection to a bit line to transmit data there between as with normal memory cells.

Word-lines (e.g., WL1) having the same height may be commonly connected, and the ground selection lines GSL1 to GSL3 and the string selection lines SSL1 to SSL3 may be separated. In FIG. 7, the memory block BLKa is illustrated to be coupled to twelve word-lines WL1 to WL12 and three bit-lines BL1 to BL3. However, exemplary embodiments are not limited thereto. In some exemplary embodiments, the memory cell array 100 may be coupled to any number of word-lines and bit-lines.

According to exemplary embodiments, the memory block BLK1 is divided into a plurality of sub-blocks, indicated by representative sub-blocks SB1, SB2, and SB3, each sub-block being smaller in size than the memory block BLKi. The sub-blocks SB1, SB2 and SB3 may be divided in a word-line direction, as shown in FIG. 6. Alternatively, the sub-blocks SB1, SB2 and SB3 may be divided on the basis of bit-lines or string selection lines. The sub-blocks SB1, SB2 and SB3 in the memory block BLKa may be erased independently regardless of the reference used to divide the memory block BLKa into sub-blocks.

FIG. 7 illustrates a cell region in which the memory cell array of FIG. 3 is formed according to exemplary embodiments. Referring to FIG. 7, a cell region CR includes a plurality of channel holes CH. A channel hole size, for example, a channel hole diameter, may be varied according to positions within the cell region CR. For example, channel holes CH adjacent to the first and second edges EDG1 and EDG2 have a low peripheral density, and thus may have a different diameter from those of other channel holes CH. A memory block BLKa may be adjacent to the second edge EDG2, and may be spaced apart from the second edge EDG2 by a first distance d1. A memory block BLKb may not be adjacent to the first and second edges EDG1 and EDG2, and be in a center of the cell region CR, and may be spaced apart from the second edge EDG2 by a second distance d2. The second distance d2 may be greater than the first distance d1. A first diameter D1 of a first channel hole CHa included in the memory block BLKa may be smaller than a second diameter D2 of a second channel hole CHb included in the memory block BLKb.

Figure 8A:
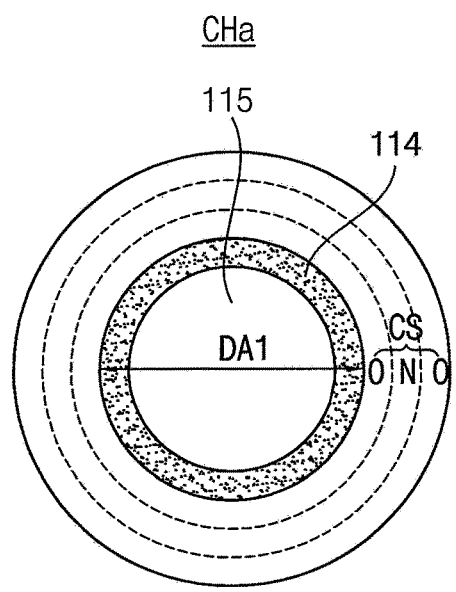
FIGS. 8A and 8B illustrate cross-sections of strings of the memory blocks of FIG. 7, respectively.
Figure 8B:
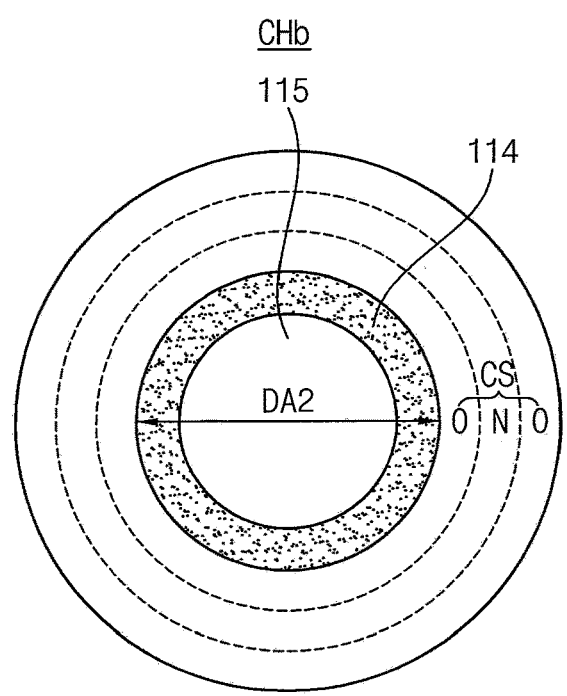

FIGS. 8A and 8B illustrate cross-sections of strings of the memory blocks BLKa and BLKb of FIG. 7, respectively. Referring to FIG. 8A, a pillar including a channel layer 114 and an internal electrically insulating layer 115 may be formed in the first channel hole CHa included in the memory block BLKa, and a charge storage layer CS may be formed around the first channel hole CHa, and the charge storage layer CS may have an (oxide-nitride-oxide) ONO structure.

Referring to FIG. 8B, a pillar including a channel layer 114 and an internal layer 115 may be formed in the second channel hole CHb included in the memory block BLKb, and a charge storage layer CS may be formed around the second channel hole CHb, and the charge storage layer CS may have an ONO structure.

In an exemplary embodiment, a thickness of the charge storage layer CS included in the memory block BLKb may be different from a thickness of the charge storage layer CS included in the memory block BLKa. Characteristics of memory cells may vary due to the difference in the channel hole diameters. For example, in a 3D memory device having a gate all around structure in which a gate electrode is disposed around a circumference of a channel hole, if a channel hole diameter is reduced, the magnitude of an electric field formed between a gate electrode (e.g., the gate electrode 213 of FIG. 6) and a channel region 114 is increased. Thus, program and erase speeds of a memory cell having a relatively small channel hole diameter like the first channel hole CHa may be higher than those of a memory cell having a relatively large channel hole diameter like the second channel hole CHb.

Referring back to FIG. 7, a memory block is formed in the cell region CR to include all memory cells corresponding to one page in the first direction D1, that is, in a word-line direction, and to include some strings in the second direction D2, that is, in a bit-line direction. Thus, each memory block extends in the first direction D1, and channel hole sizes, that is, channel hole diameters may differ in units of memory blocks. Thus, program and erase speeds of memory cells included in the memory block BLKa may be higher than program and erase speeds of memory cells included in the memory block BLKb.

Figure 9:
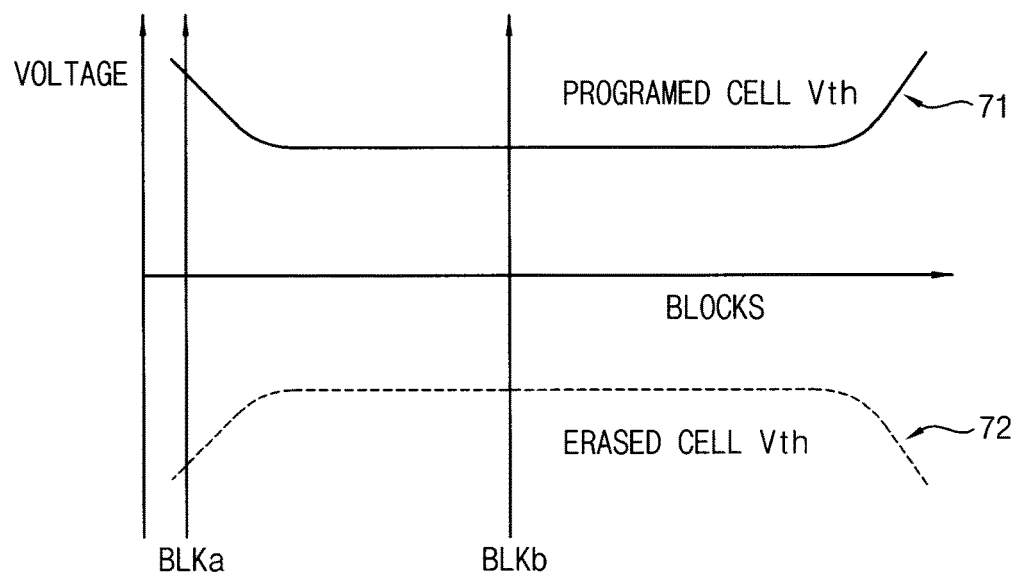
FIG. 9 is a graph showing a result of performing a program operation and an erase operation on the memory blocks in FIG. 7.

FIG. 9 is a graph showing a result of performing a program operation and an erase operation on the memory blocks in FIG. 7. Referring to FIG. 9, a horizontal axis denotes positions of memory blocks in the second direction D2, that is, a bit-line direction, and a vertical axis denotes a threshold voltage. For example, a solid line 71 denotes a central value of threshold voltages according to memory block positions of a programmed memory cell, and a dotted line 72 denotes a central value of threshold voltages according to memory block positions of an erased memory cell.

As described above, the threshold voltage distribution, as indicated by the solid line 71, of programmed memory cells may have a U shape. In addition, the threshold voltage distribution, as indicated by the dotted line 72, of erased memory cells may have an inverted U shape.

Figure 10:
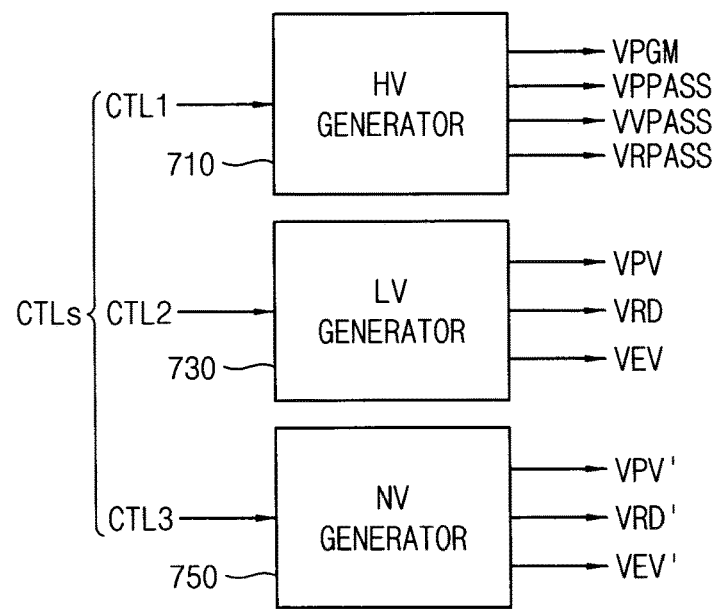
FIG. 10 is a block diagram illustrating the voltage generator in the nonvolatile memory device of FIG. 3 according to exemplary embodiments.

FIG. 10 is a block diagram illustrating the voltage generator in the nonvolatile memory device of FIG. 3 according to exemplary embodiments. Referring to FIG. 10, the voltage generator 700 may include a high voltage generator 710 and a low voltage generator 730. The voltage generator 700 may further include a negative voltage generator 750.

The high voltage generator 710 may generate a program voltage PGM, a program pass voltage VPPASS, a verification pass voltage VVPASS, and a read pass voltage VRPASS according to operations directed by the command CMD, in response to a first control signal CTL1 of the control signals CTLs. The program voltage VPGM is applied to the selected word-line, the program pass voltage VPPASS, the verification pass voltage VVPASS, and the read pass voltage VRPASS may be applied to the unselected word-lines. The first control signal CTL1 may include a plurality of bits which indicate the operations directed by the command CMD.

The low voltage generator 730 may generate a program verification voltage VPV, a read voltage VRD, and an erase verification voltage VER according to operations directed by the command CMD, in response to a second control signal CTL2 of the control signals CTLs. The program verification voltage VEV, the read voltage VRD, and the erase verification voltage VEV may be applied to the selected word-line according to operation of the nonvolatile memory device 50. The second control signal CTL2 may include a plurality of bits which indicate the operations directed by the command CMD.

The negative voltage generator 750 may generate a program verification voltage VPV', a read voltage VRD' and an erase verification voltage VEV' which have negative levels according to operations directed by the command CMD, in response to a third control signal CTL3 of the control signals CTLs. The third control signal CTL3 may include a plurality of bits which indicate the operations directed by the command CMD.

Figure 11:
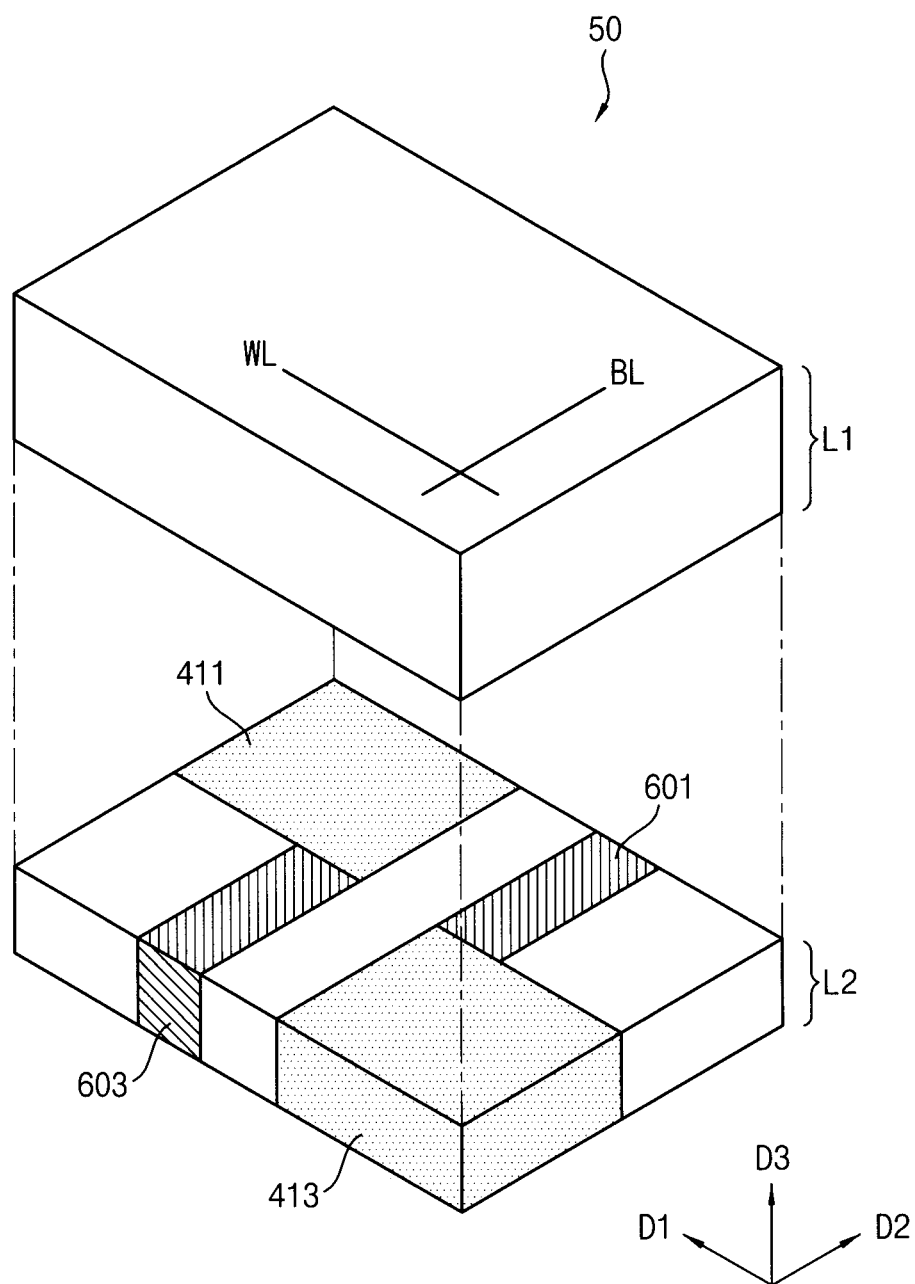
FIG. 11 is a view illustrating a structure of the nonvolatile memory device including the first and second semiconductor layers according to exemplary embodiments.
Figure 12:
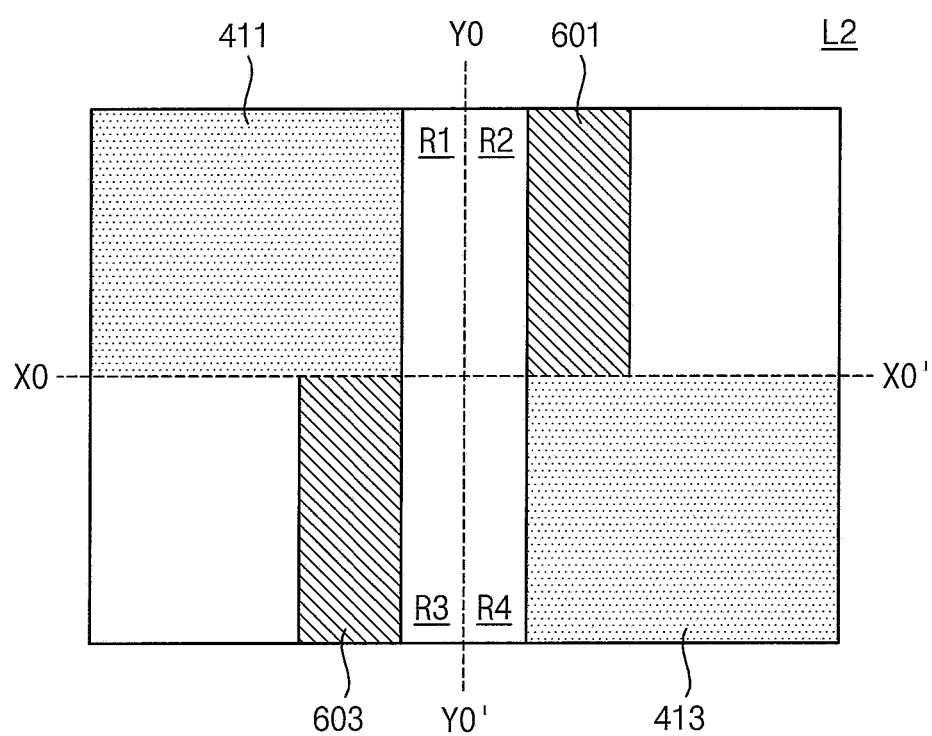
FIG. 12 is a plan view illustrating a top surface of the second semiconductor layer contacting the first semiconductor layer of the nonvolatile memory device according to exemplary embodiments.
Figure 13:
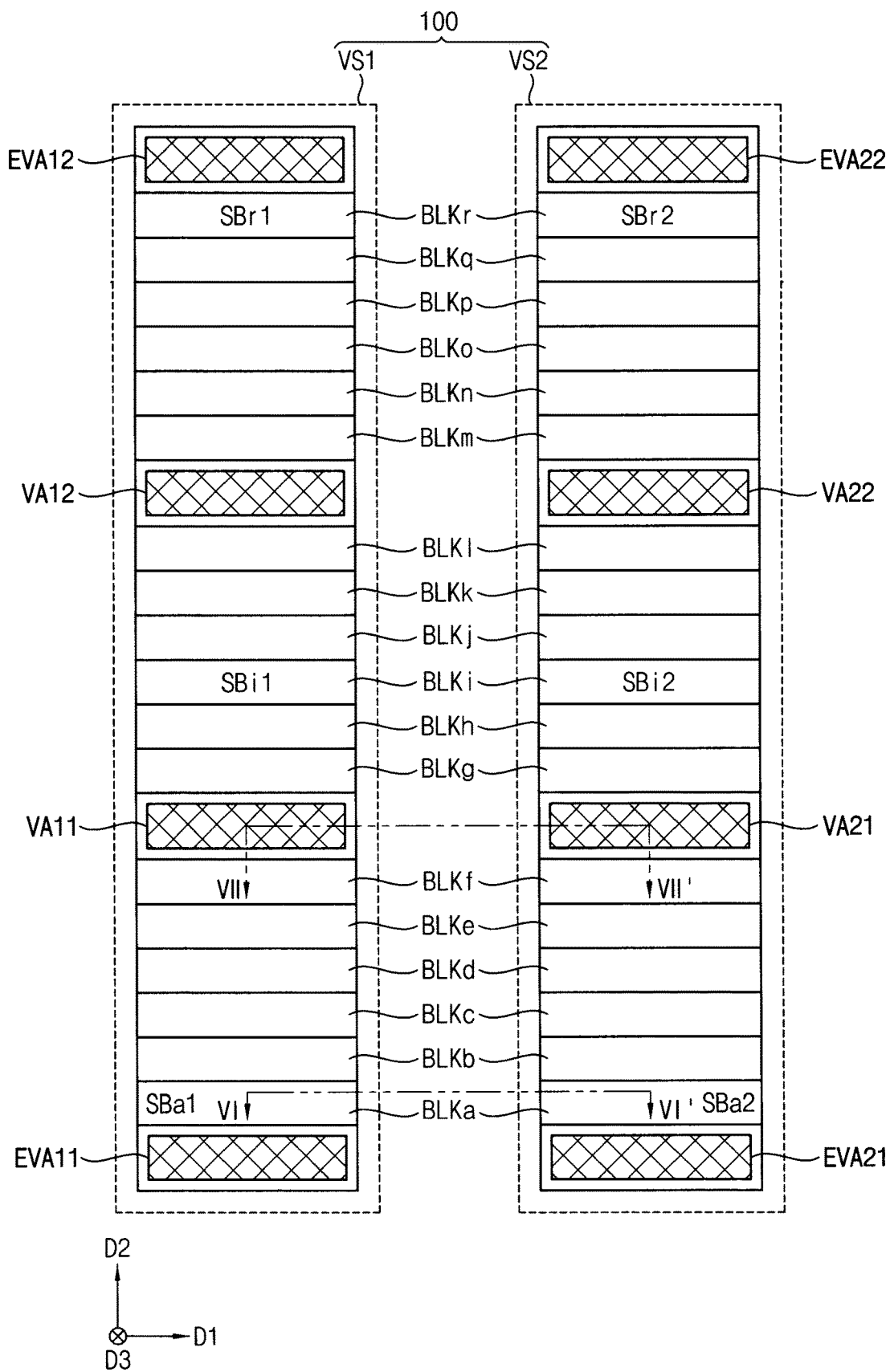
FIG. 13 is a plan view illustrating a top surface of the first semiconductor layer, overlapping the plan view of the FIG. 12.

FIG. 11 is a view illustrating a structure of the nonvolatile memory device including the first and second semiconductor layers according to exemplary embodiments. FIG. 12 is a plan view illustrating a top surface of the second semiconductor layer contacting the first semiconductor layer of the nonvolatile memory device according to exemplary embodiments. FIG. 13 is a plan view illustrating a top surface of the first semiconductor layer, overlapping the plan view of the FIG. 12.

In FIGS. 11 to 13, the first and second semiconductor layers L1 and L2 are spaced apart from each other in the third direction for convenience of explanation. However, a bottom surface of the first semiconductor layer L1 and the top surface of the second semiconductor layer L2 actually contact each other as shown in FIG. 4.

Referring to FIGS. 11 through 13, the first and second address decoders 601 and 603 may extend in a direction (e.g., the second direction in which the word-lines WL are arranged) perpendicular to a direction in which the word lines WL extend. In addition, the first and second page buffer circuits 411 and 413 may extend in a direction (e.g., the first direction in which the bit-lines BL are arranged) perpendicular to the bit-lines BL. In other words, in the nonvolatile memory device 50 having a COP structure, the row decoder 600 (see FIG. 3) and the page buffer circuit 410 (see FIG. 3) may be divided into two or more parts and may be arranged as shown in FIGS. 11 and 12 to increase the area of the address decoder 600 and the page buffer circuit 410 overlapping the memory cell array 100 (see FIG. 3) of the first semiconductor layer L1 in the third direction.

Referring to FIG. 12, the second semiconductor layer L2 may be divided into first through fourth regions R1 through R4 by a first virtual line X0-X0' in the first direction parallel to the word-lines WL and a second virtual line Y0-Y0' in the second direction parallel to the bit-lines BL.

For example, the first virtual line X0-X0' and the second virtual line Y0-Y0' may overlap the memory cell array 100 (see FIG. 3) located on the first semiconductor layer L1 in the third direction. In other words, at least a part of each of the first through fourth regions R1 through R4 may overlap the memory cell array 100 located on the first semiconductor layer L1 in the third direction. The first and second address decoders 601 and 603 may be respectively located in the second and third regions R2 and R3, and the first and second page buffer circuits 411 and 413 may be respectively located in the first and fourth regions R1 and R4.

Referring to FIG. 13, the memory cell array 100 may be located on the first semiconductor layer L1, and the memory cell array 100 may include a first vertical structure VS1 and a second vertical structure VS2. As shown in FIG. 13, the memory cell array 100 may include a plurality of memory blocks BLKa-BLKr formed as the first and second vertical structures VS1 and VS2. The memory blocks BLK1-BLKr may be arranged in the second direction. Each of the memory blocks BLKa-BLKr may include a first sub-block and a second sub-block. The memory block BLKa includes a first sub-block SBa1 and a second sub-block SBa2. The memory block BLKi includes a first sub-block SBi1 and a second sub-block SBi2. The memory block BLKr includes a first sub-block SBr1 and a second sub-block SBr2.

As shown in FIG. 13, the first vertical structure VS1 may include a plurality of first sub-blocks of the memory blocks BLKa-BLKr and a plurality of first via areas EVA11, VA11, VA12 and EVA12 which are spaced apart in a second direction. In addition, the second vertical structure VS2 may include a plurality of second sub-blocks of the memory blocks BLKa-BLKr and a plurality of second via areas EVA21, VA21, VA22 and EVA22 which are spaced apart in a second direction. The first sub-blocks may be arranged among the first via areas EVA11, VA11, VA12 and EVA12 and the second sub-blocks may be arranged among the second via areas EVA21, VA21, VA22 and EVA22.

The first via areas EVA11 and EVA12 adjacent to edges in a second direction and in the first sub-blocks may be referred to as first and second edge via areas, respectively. The first via areas EVA21 and EVA22 adjacent to edges in a second direction and in the second sub-blocks may be referred to as third and fourth edge via areas, respectively.

For example, in the first via areas VA11 and VA12, one or more first through-hole vias that each pass through the first vertical structure VS1 and are connected to the first page buffer circuit 411 may be formed. In addition, in the second via areas VA21 and VA22, one or more second through-hole vias that each pass through the second vertical structure VS2 and are connected to the second page buffer circuit 413 may be formed.

For example, in the first and second edge via areas EVA11 and EVA12, one or more edge through-hole vias that each pass through the first vertical structure VS1 and are connected to the second address decoder 603 may be formed. In addition, in the third and fourth edge via areas EVA21 and EVA22, one or more edge through-hole vias that each pass through the second vertical structure VS22 and are connected to the first address decoder 601 may be formed.

Figure 14:
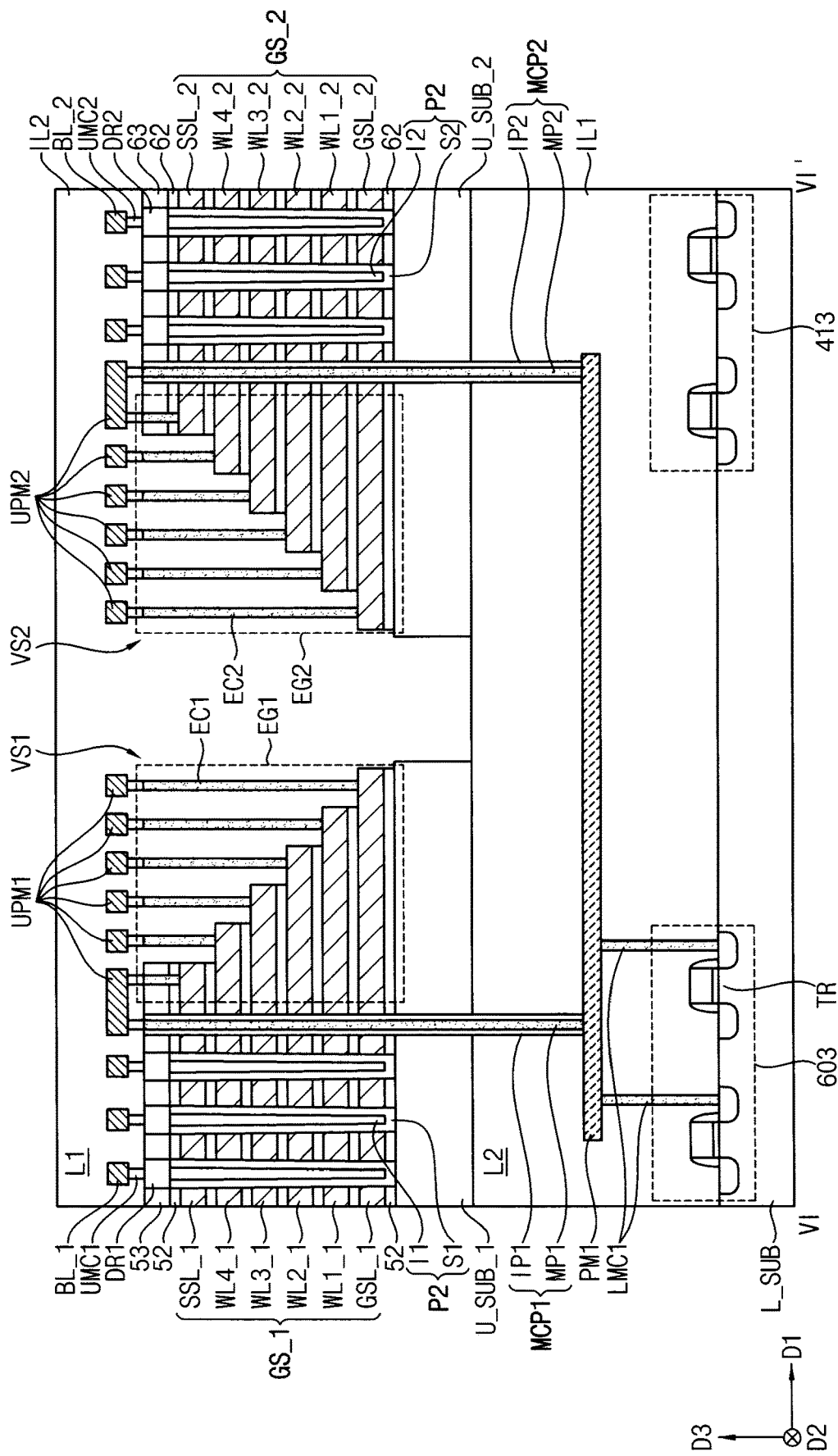
FIG. 14 is a cross-sectional view taken along line VI-VI' of FIG. 13, illustrating configurations of the first and second semiconductor layers.

FIG. 14 is a cross-sectional view of the nonvolatile memory device according to exemplary embodiments. For example, FIG. 14 is a cross-sectional view taken along line VI-VI' of FIG. 13, illustrating configurations of the first and second semiconductor layers. Referring to FIG. 14, the second semiconductor layer L2 may include a lower substrate L_SUB, and the second address decoder 603 and the second page buffer circuit 413 formed on the lower substrate L_SUB. In addition, the second semiconductor layer L2 may include a plurality of first lower contacts LMC1 electrically connected to the second address decoder 603, a first lower conductive line PM1 electrically connected to the plurality of first lower contacts LMC1, and a lower insulating layer IL1 covering the plurality of first lower contacts LMC1 and the first lower conductive line PM1.

The second address decoder 603 and the second page buffer circuit 413 may be formed on portions of the lower substrate L_SUB. In other words, the address decoder 603 and/or the second page buffer circuit 413 may be formed by forming a plurality of transistors TR on the lower substrate L_SUB.

The first semiconductor layer L1 may include a first upper substrate U_SUB_1, a second upper substrate U_SUB_2, the first vertical structure VS1 located on the first upper substrate U_SUB_1, and the second vertical structure VS2 located on the second upper substrate U_SUB_2. In addition, the first semiconductor layer L1 may include a plurality of first upper contacts UMC1, a plurality of first bit-lines BL1, a plurality of first edge contacts EC1, and a plurality of first upper conductive lines UPM1 which are electrically connected to the first vertical structure VS1. In addition, the first semiconductor layer L1 may include a plurality of second upper contacts UMC2, a plurality of second bit-lines BL2, a plurality of second edge contacts EC2, and a plurality of second upper conductive lines UPM2 which are electrically connected to the second vertical structure VS2. In addition, the first semiconductor layer L1 may include an upper insulating and passivation layer IL2 covering the first and second vertical structures VS1 and VS2 and various conductive lines.

The first and second upper substrates U_SUB_1 and U_SUB_2 may be support layers that respectively support first and second gate conductive layers GS_1 and GS_2. The first and second upper substrates U_SUB_1 and U_SUB_2 may be, for example, base substrates.

The first vertical structure VS1 may include the first gate conductive layers GS_1 located on the first upper substrate U_SUB_1, and a plurality of pillars P1 that pass through the first gate conductive layers GS_1 and extend in the third direction on a top surface of the first upper substrate U_SUB_1. The first gate conductive layers GS_1 may include a ground selection line GSL_1, word-lines WL1_1 through WL4_1, and a string selection line SSL_1. The ground selection line GSL_1, the word-lines WL1_1 through WL4_1, and the string selection line SSL_1 may be sequentially formed on the first upper substrate U_SUB_1, and an insulating layer 52 may be located under or over each of the first gate conductive layers GS_1. Since the first and second vertical structures VS1 and VS2 have corresponding configurations in the cross-sectional view taken along line VI-VI' of the first memory block BLK1 of FIG. 14, a repeated explanation of elements of the second vertical structure VS2 corresponding to those of the first vertical structure VS1 may not be given.

The second vertical structure VS2 may include a plurality of pillars P2 that pass through the second gate conductive layers GS_2. Each of the pillars P2 may include a surface layer S2 and an inside 11. The second gate conductive layers GS_2 may include a ground selection line GSL_2, word lines WL1_2 through WL4_2, and a string selection line SSL_2. An insulating layer 62 may be located under or over each of the second gate conductive layers GS_2.

Each of the plurality of pillars P1 may include a surface layer S1 and an inside 11. For example, the surface layer S1 of each of the pillars P1 may include a silicon material doped with an impurity, or a silicon material not doped with an impurity.

For example, the ground selection line GSL_1 and a portion of the surface layer S1 adjacent to the ground selection line GSL_1 may constitute the ground selection transistor GST (see FIG. 6). In addition, the word-lines WL1_1 through WL4_1 and a portion of the surface layer S1 adjacent to the word-lines WL1_1 through WL4_1 may constitute the memory cell transistors MC1-MC8 (see FIG. 6). In addition, the string selection line SSL_1 and a portion of the surface layer S1 adjacent to the string selection line SSL_1 may constitute the string selection transistor SST (see FIG. 6).

A drain region DR1 may be formed on the pillar P1. A drain region DR2 may be formed on the pillar P2. For example, the drain region DR1 may include a silicon material doped with an impurity. An etch-stop film 53 may be formed on a side wall of the drain region DR1. An etch-stop film 63 may be formed on a side wall of the drain region DR2.

The first vertical structure VS1 may include an edge region EG1. The second vertical structure VS2 may include an edge region EG2. As shown in FIG. 14, a cross-section of the edge region EG1 may form a stepped pad structure. The stepped pad structure may be referred to as a "word line pad". The plurality of first edge contacts EC1 may be connected to the edge region EG1, and an electrical signal may be applied from a peripheral circuit such as the second row decoder 134 through the first edge contacts EC1. For example, a contact plug MCP1 that passes through the first vertical structure VS_1, the first upper substrate U_SUB_1, and a part of the second semiconductor layer L2 may have one side connected to the first lower conductive line PM1 and the other side electrically connected to the edge region EG1 through the first upper conductive lines UPM1.

At least some of the first edge contacts EC1 may pass through parts of the first and second semiconductor layers L1 and L2 in the third direction between the first and second upper substrates U_SUB_1 and U_SUB_2 and may have one side electrically connected to a contact plug connected to the lower conductive line (e.g., PM1).

Figure 15:
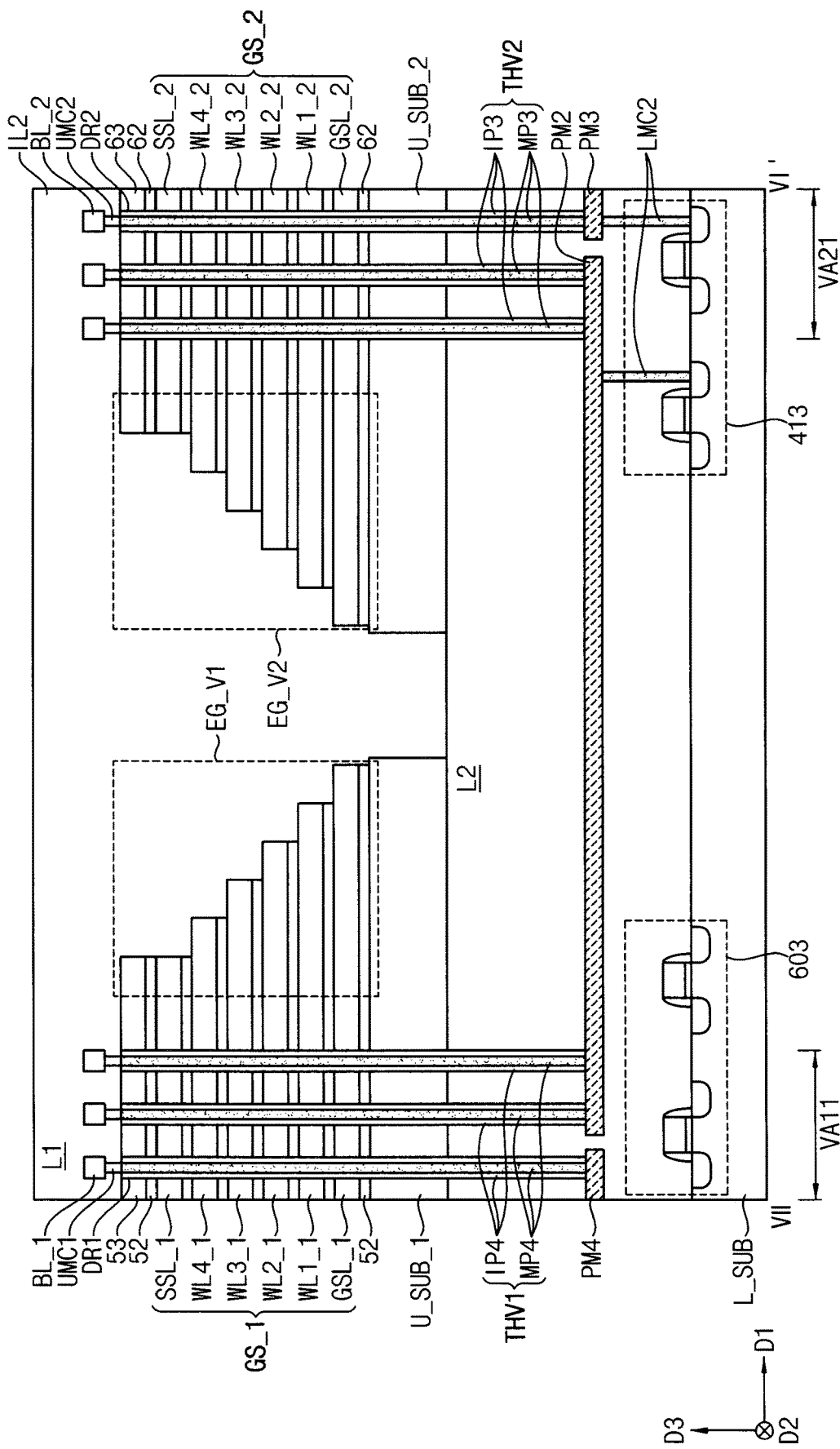
FIG. 15 is a cross-sectional view taken along line VII-VII' of FIG. 13, illustrating configurations of the first and second semiconductor layers.

FIG. 15 is a cross-sectional view taken along line VII-VII' of FIG. 13, illustrating configurations of the first and second semiconductor layers. For example, FIG. 15 may be a cross-sectional view illustrating the second semiconductor layer L2 overlapping the first partial block SB_1 and the via areas VA11 and VA21 provided in the first semiconductor layer L1. A repeated explanation of the same elements in FIG. 14 need not be given in FIG. 15.

Referring to FIG. 15, a plurality of through-hole vias THV1 passing through the first vertical structure VS1, the first upper substrate U_SUB_1, and a part of the second semiconductor layer L2 may be formed in the first via region VA11. Each of the through-hole vias THV1 may include an insulating film pattern IP4 and a conductive pattern MP4. As shown in FIG. 7, each of the through-hole vias THV may electrically connect the second page buffer 144 and the second upper contact UMC2. A plurality of through-hole vias THV2 passing through the second vertical structure VS2, the second upper substrate U_SUB_2, and a part of the second semiconductor layer L2 may be formed in the second via region VA21. Each of the through-hole vias THV2 may include an insulating film pattern IP3 and a conductive pattern MP3.

As shown in FIG. 15, each of the through-hole vias THV2 may electrically connect the second page buffer circuit 413 and the second upper contact UMC2 and each of the through-hole vias THV2 may electrically connect the second page buffer circuit 413 and the first upper contact UMC1. The first upper contact UMC1 may be connected to the first bit-line BL1 The second upper contact UMC2 may be connected to the second bit-line BL2. In other words, the first bit-lines BL1 may be electrically connected to the second page buffer circuit 413 formed on the second semiconductor layer L2 through the plurality of through-hole vias THV1 formed in the first via area VA11 and the second bit-lines BL2 may be electrically connected to the second page buffer circuit 413 formed on the second semiconductor layer L2 through the plurality of through-hole vias THV2 formed in the second via area VA21. In exemplary embodiments, conductive patterns such as contacts may not be formed in the edge region EG_V1 of the first via area VA11 and in the edge region EG_V2 of the second via area VA21.

Since continuity characteristic of channel holes may be varied based on whether the channel holes are close to the via areas EVA11, VA11, VA12 and EVA12 in FIGS. 13 through 15, the memory blocks BLKa-BLKr may be grouped based on whether the memory blocks are close to the via areas EVA11, VA11, VA12 and EVA12.

Figure 16:
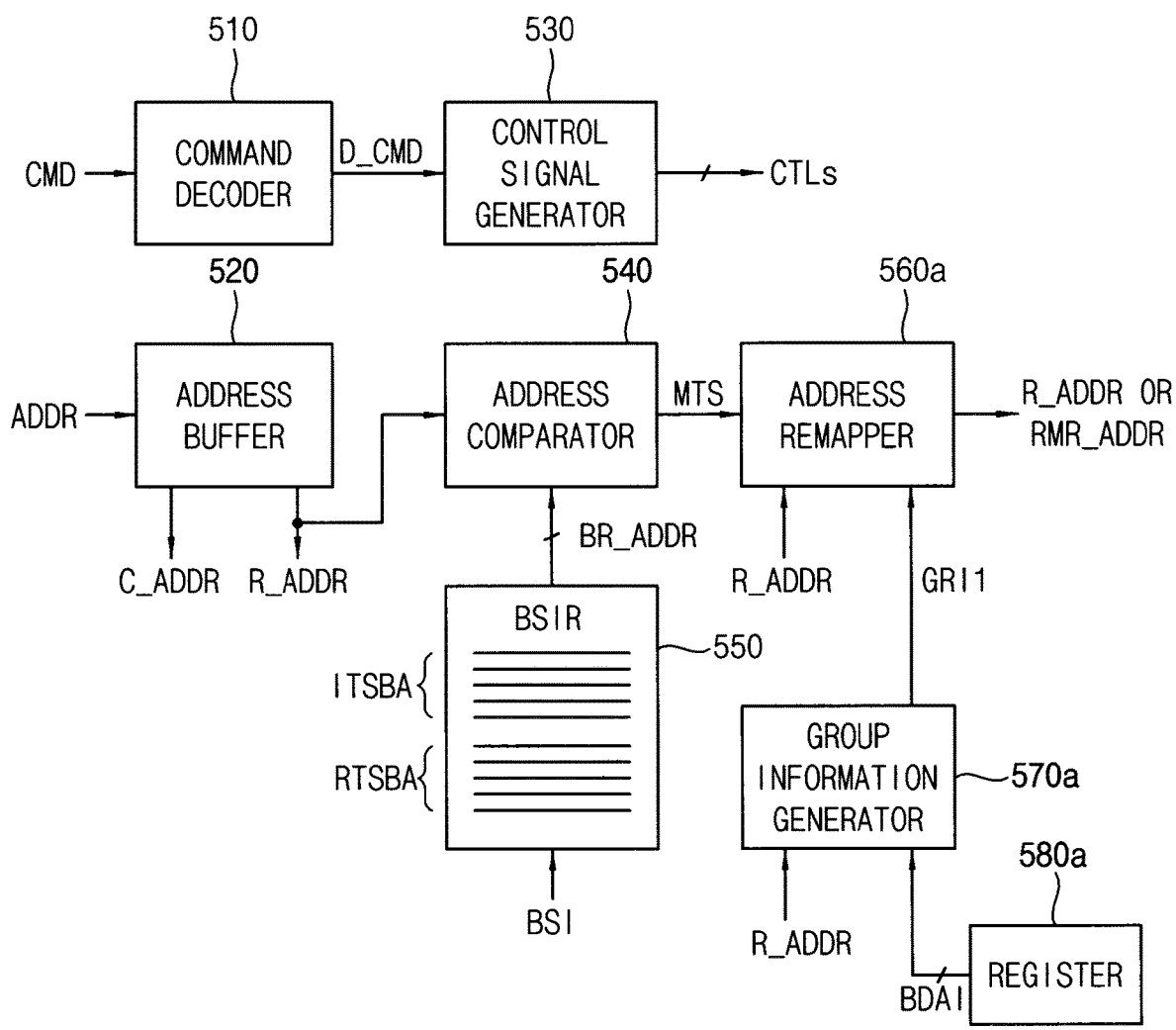
FIG. 16 is a block diagram illustrating an example of the control circuit in the nonvolatile memory device of FIG. 3 according to exemplary embodiments.
Figure 17:
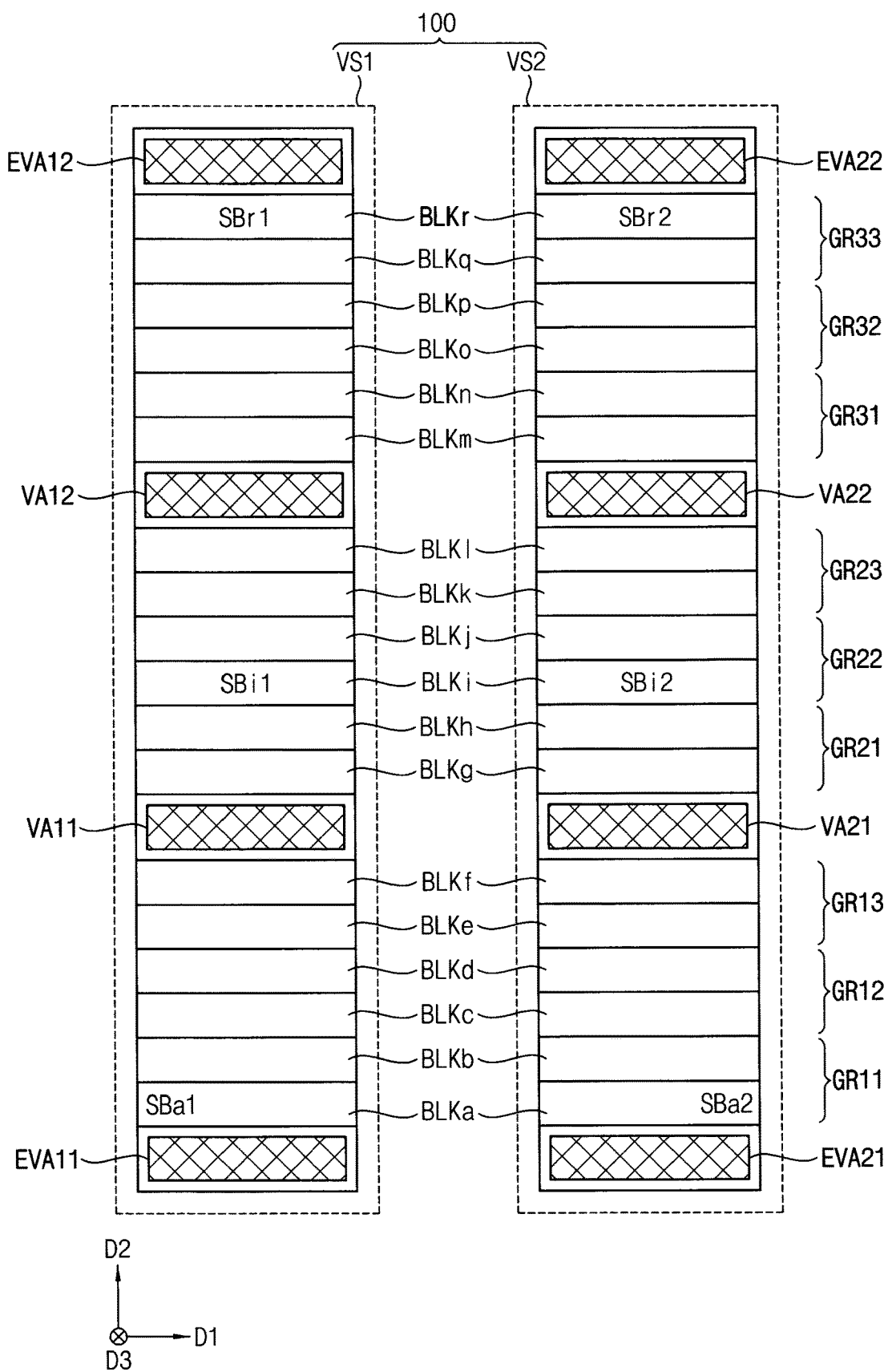
FIG. 17 illustrates an example of grouping of the memory blocks, which is performed by the control circuit of FIG. 16.

FIG. 16 is a block diagram illustrating an example of the control circuit in the nonvolatile memory device of FIG. 3 according to exemplary embodiments, and FIG. 17 illustrates an example of grouping of the memory blocks, which is performed by the control circuit of FIG. 16.

Referring to FIG. 16, a control circuit 500a may include a command decoder 510, an address buffer 520, a control signal generator 530, an address comparator 540, a bad sub-block information register 550, an address re-mapper 560a, a group information generator 570a and a register 580a.

The command decoder 510 decodes the command CMD and provides a decoded command D_CMD to the control signal generator 530a. The address buffer 520 receives the address signal ADDR, provides the row address R_ADDR to the address decoder 600, the address comparator 540, the address re-mapper 560a, and the group information generator 570a and provides the column address C_ADDR to the data input/output circuit 420.

The bad sub-block information register 550 may store the bad sub-block information BSI, and the bad sub-block information BSI may include initial bad sub-block addresses ITSBA and run-time bad sub-block addresses RTSBA. The initial bad sub-block addresses ITSBA are addresses of bad sub blocks designated when the nonvolatile memory device 50 is shipped. The run-time bad sub-block addresses RTSBA are addresses of bad sub blocks designated when the nonvolatile memory device 50 is operating.

The control signal generator 530a receives the decoded command D_CMD, generates the control signals CTLs based on whether an operation directed by the decoded command D_CMD and provides the control signals CTLs to the voltage generator 700.

The address comparator 540 compares the row address R_ADDR with at least one bad sub-block row address BR_ADDR stored in the bad sub-block information register 550 and provides the address re-mapper 550a with a match signal MTS indicating a result of the comparison of the row address R_ADDR with the at least one bad sub-block row address BR_ADDR.

The register 580a may store boundary address information BADI associated with each location of the first via areas EVA11, VA11, VA12 and EVA12 and may provide the boundary address information BADI to the group information generator 570a. The group information generator 570a may receive the row address R_ADDR and the boundary address information BADI, may generate a group address information GAI1 indicating a group to which a memory block accessed by the row address R_ADDR belongs to, of the plurality of groups, based on a comparison of the row address R_ADDR and the boundary address information BADI and may provide the group address information GAI1 to the address re-mapper 560a.

The address re-mapper 560a may receive the match signal MTS, the row address R_ADDR and the group address information GAI1, may selectively perform an address re-mapping on the row address R_ADDR and may output one of the row address R_ADDR and a re-mapped address RMR_ADDR. For example, if the match signal MTS indicates that the row address R_ADDR does not match at least one of the bad sub-block row address BR_ADDR, the address re-mapper 560a outputs the row address R_ADDR. For example, if the match signal MTS indicates that the row address R_ADDR matches at least one of the bad sub-block row address BR_ADDR, the address re-mapper 560a outputs the re-mapped address RMR_ADDR by re-mapping the row address R_ADDR.

Referring to FIGS. 16 and 17, the control circuit 500a may groups the memory blocks BLKa~BLKr into a plurality of groups GR11~GR13, GR21~GR23 and GR31~GR33 based on whether the memory blocks BLKa~BLKr are close to the first via areas EVA11, VA11, VA12 and EVA12 and may perform address re-mapping such that at least one sub-block of a second memory block in a first group is selected in response to a defect occurring in a first memory block, accessed by the row address R_ADDR, in a first group of the plurality of groups. In FIG. 17, since the memory blocks BLKa and BLKb are close to the via area EVA11, the memory blocks BLKa and BLKb are grouped into the group GR11, since the memory blocks BLKe and BLKf are close to the via area VA11, the memory blocks BLKe and BLKf are grouped into the group GR13, and since the memory blocks BLKc and BLKd are not close to the via areas EVA11 and VA11, the memory blocks BLKc and BLKd are grouped into the group GR12. Similar description may be applied to the memory blocks BLKg~BLKr.

Figure 18:
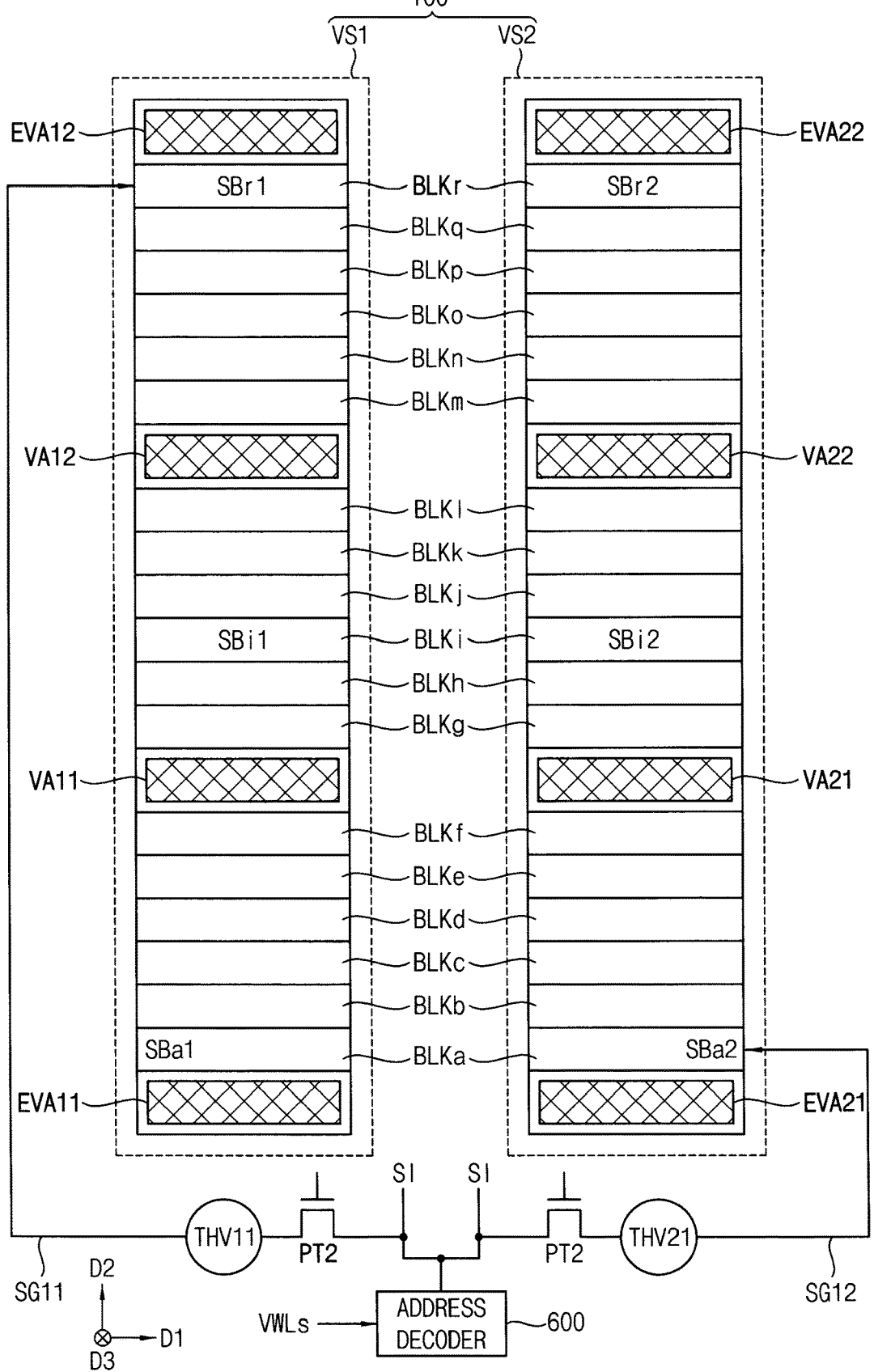
FIG. 18 illustrates a connection relationship of the address decoder and the memory cell array in the nonvolatile memory device of FIG. 3.

FIG. 18 illustrates a connection relationship of the address decoder and the memory cell array in the nonvolatile memory device of FIG. 3.

In FIG. 18, the memory cell array 100 and the address decoder 600 in FIG. 13 are illustrated, the address decoder 600 is connected to the first vertical structure VS1 through a selection line SI, an edge through-hole via THV11, a pass transistor PT1 and a signal line SG11, and is connected to the second vertical structure VS2 through a selection line SI, an edge through-hole via THV21, a pass transistor PT2 and a signal line SG12. The address decoder 600 transfers the word-line voltages VWLs to the first and second vertical structures VS1 and VS2. The edge through-hole vias THV11 and THV21 may be provided in edge via areas EVA11 and EVA12. Since the selection line SI and the signal lines SG11 and SG12 use lower metal line formed in the second semiconductor layer L2, a signal line loading, which occurs when the word-line voltages VWLs are transferred to each of the memory blocks BLKa~BLKr, may be different according to a distance from the first edge via area EVA11 in a second direction.

Figure 19:
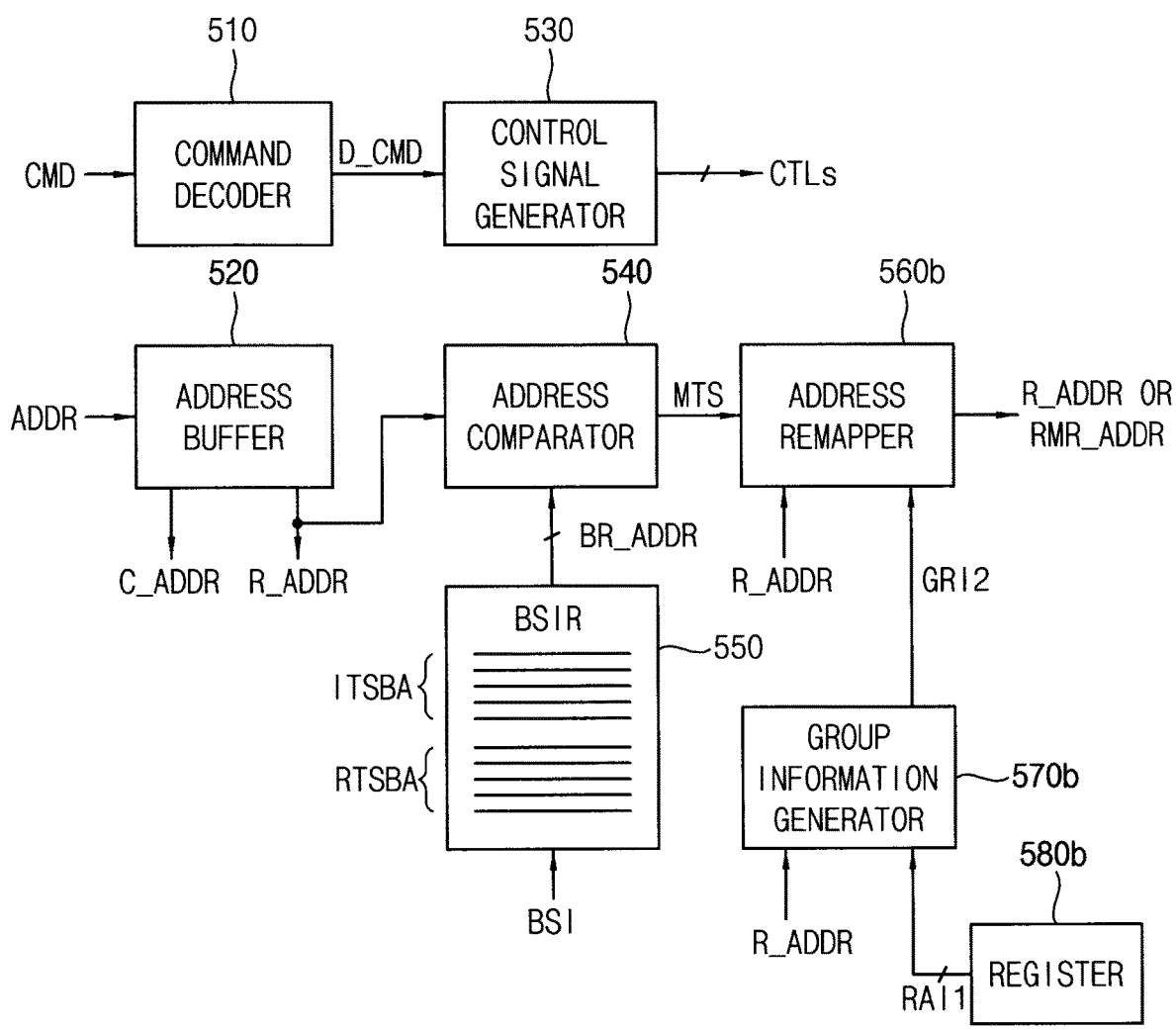
FIG. 19 is a block diagram illustrating an example of the control circuit in the nonvolatile memory device of FIG. 3 according to exemplary embodiments.
Figure 20:
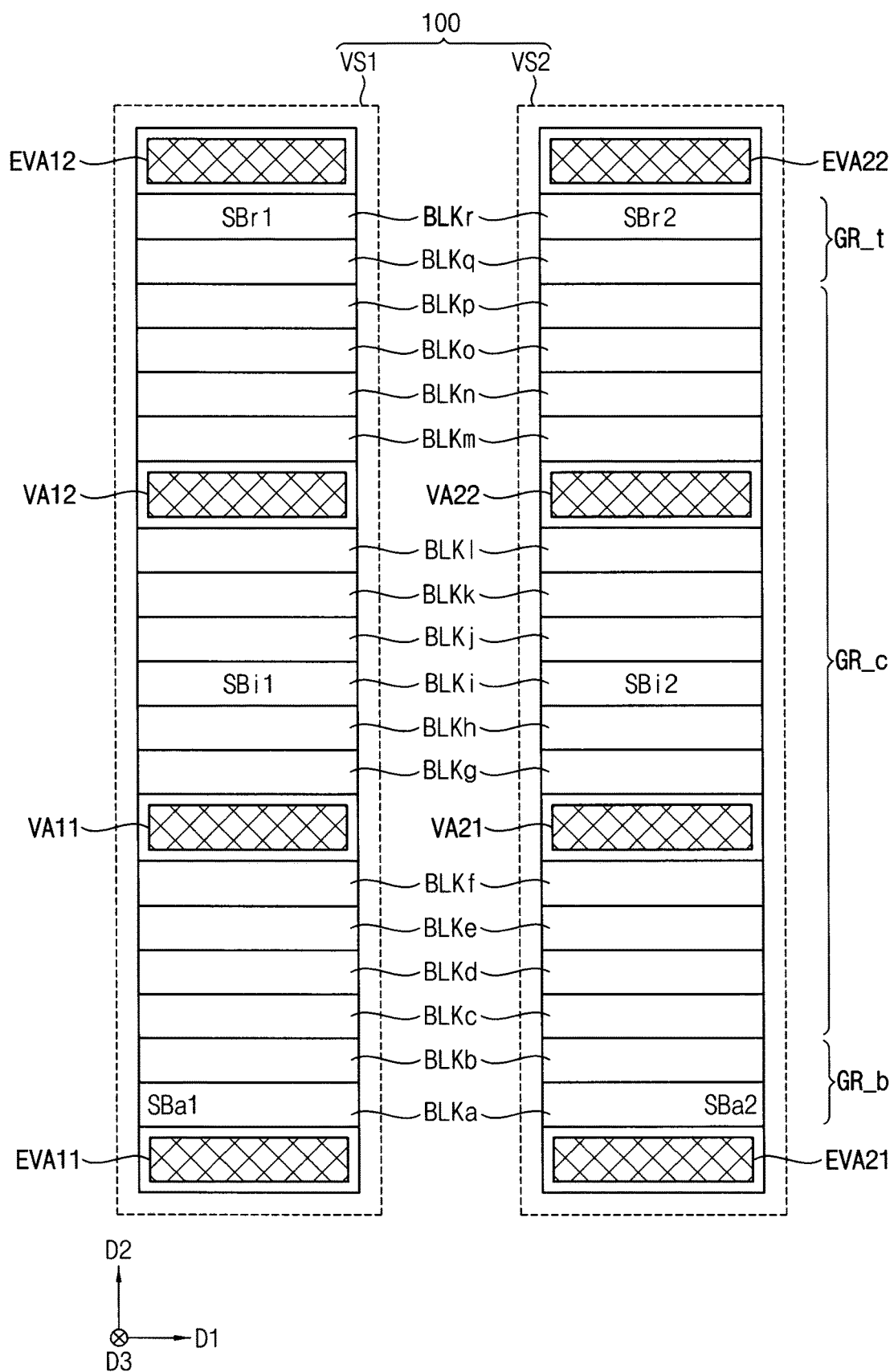
FIG. 20 illustrates an example of grouping of the memory blocks, which is performed by the control circuit of FIG. 19.

FIG. 19 is a block diagram illustrating an example of the control circuit in the nonvolatile memory device of FIG. 3 according to exemplary embodiments, and FIG. 20 illustrates an example of grouping of the memory blocks, which is performed by the control circuit of FIG. 19.

Referring to FIG. 19, a control circuit 500b may include a command decoder 510, an address buffer 520, a control signal generator 530, an address comparator 540, a bad sub-block information register 550, an address re-mapper 560b, a group information generator 570b and a register 580b. The control circuit 500b of FIG. 19 differs from the control circuit 500a of FIG. 16 in the address re-mapper 550b, the group information generator 570b and the register 580b. The register 580b may store a reference address information RAI1 associated with a distance from the first edge via area EVA11 and may provide the reference address information RAI1 to the group information generator 570b. The group information generator 570b may receive the row address R_ADDR and the reference address information RAI1, may generate a group address information GAI2 indicating a group to which a memory block accessed by the row address R_ADDR belongs to, of the plurality of groups, based on a comparison of the row address R_ADDR and the reference address information RAI1 and may provide the group address information GAI2 to the address re-mapper 560b.

For example, if the match signal MTS indicates that the row address R_ADDR does not match at least one of the bad sub-block row address BR_ADDR, the address re-mapper 560b outputs the row address R_ADDR. For example, if the match signal MTS indicates that the row address R_ADDR matches at least one of the bad sub-block row address BR_ADDR, the address re-mapper 560a outputs the re-mapped address RMR_ADDR by re-mapping the row address R_ADDR.

Referring to FIGS. 19 and 20, the control circuit 500b may groups the memory blocks BLKa~BLKr into a bottom group CR_b, a center group CR_c and a top group GR_t based on a distance from the first edge via area EVA11 and may perform address re-mapping such that at least one sub-block of a second memory block in a first group is selected in response to a defect occurring in a first memory block, accessed by the row address R_ADDR, in a first group of the plurality of groups. In FIG. 20, since the memory blocks BLKa and BLKb have associated distance from the first edge via area EVA11, which is smaller than or equal to a first reference value, the memory blocks BLKa and BLKb are grouped into the bottom group CR_b, since the memory blocks BLKc~BLKo have associated distance from the first edge via area EVA11, which is greater than the first reference value and is smaller than or equal to a second reference value smaller, the memory blocks BLKc~BLKo are grouped into the center group CR_c, and since the memory blocks BLKp and BLKr have associated distance from the first edge via area EVA11, which is greater than the second reference value, the memory blocks BLKp and BLKr are grouped into the top group GR_t.

In addition, the control circuit 500b performs the address re-mapping in a selected memory block in each of the bottom group GR_b, the center group GR_c and the top group GR_t and distance from a pass transistor to the selected memory block is substantially the same. In addition, the control circuit 500b may store data to be processed with a relative high speed in the bottom group GR_b and the relative high speed is faster than a reference speed.

Figure 21:
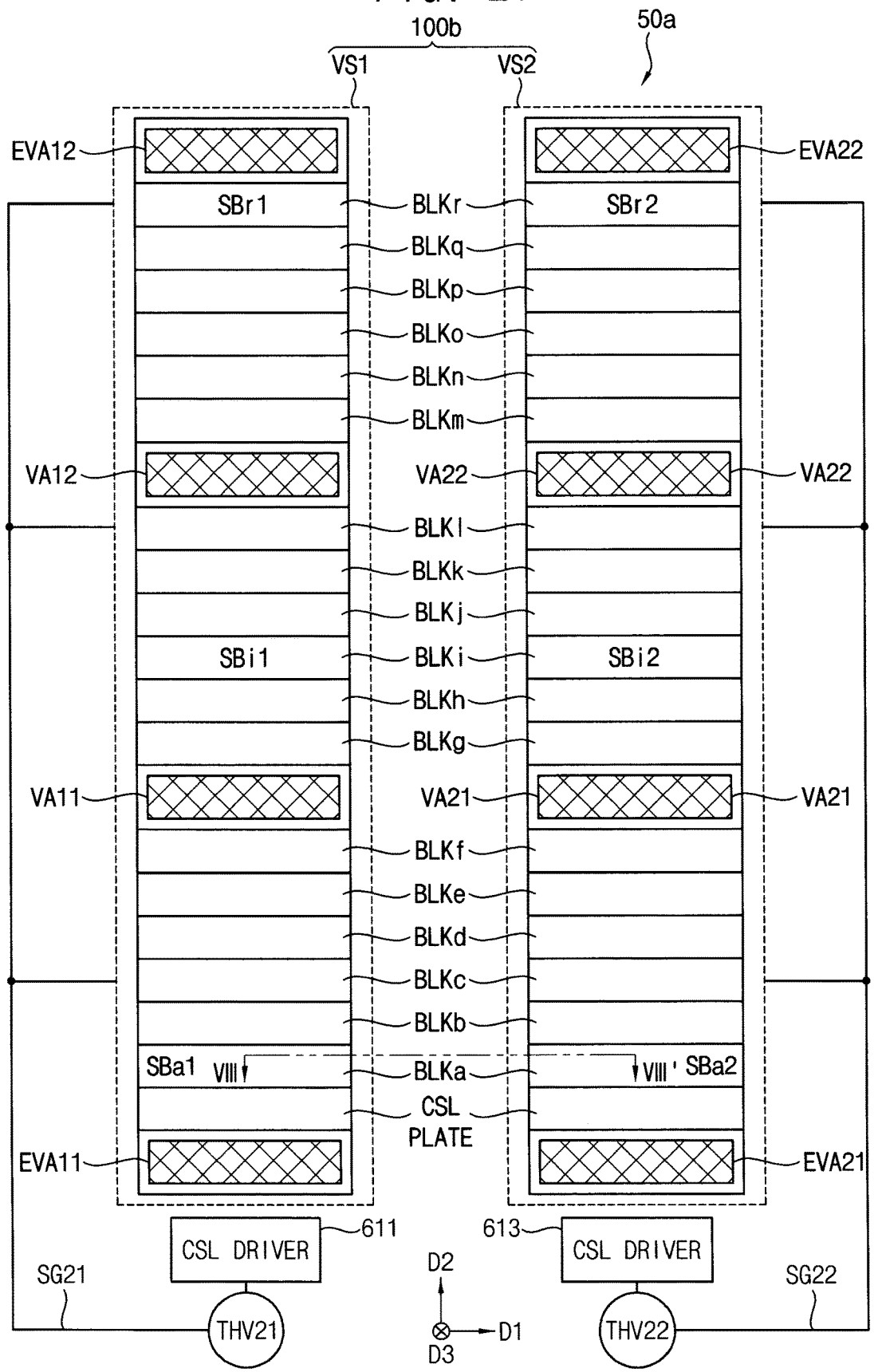
FIG. 21 illustrates a nonvolatile memory device including first and second vertical structures according to exemplary embodiments.
Figure 22:
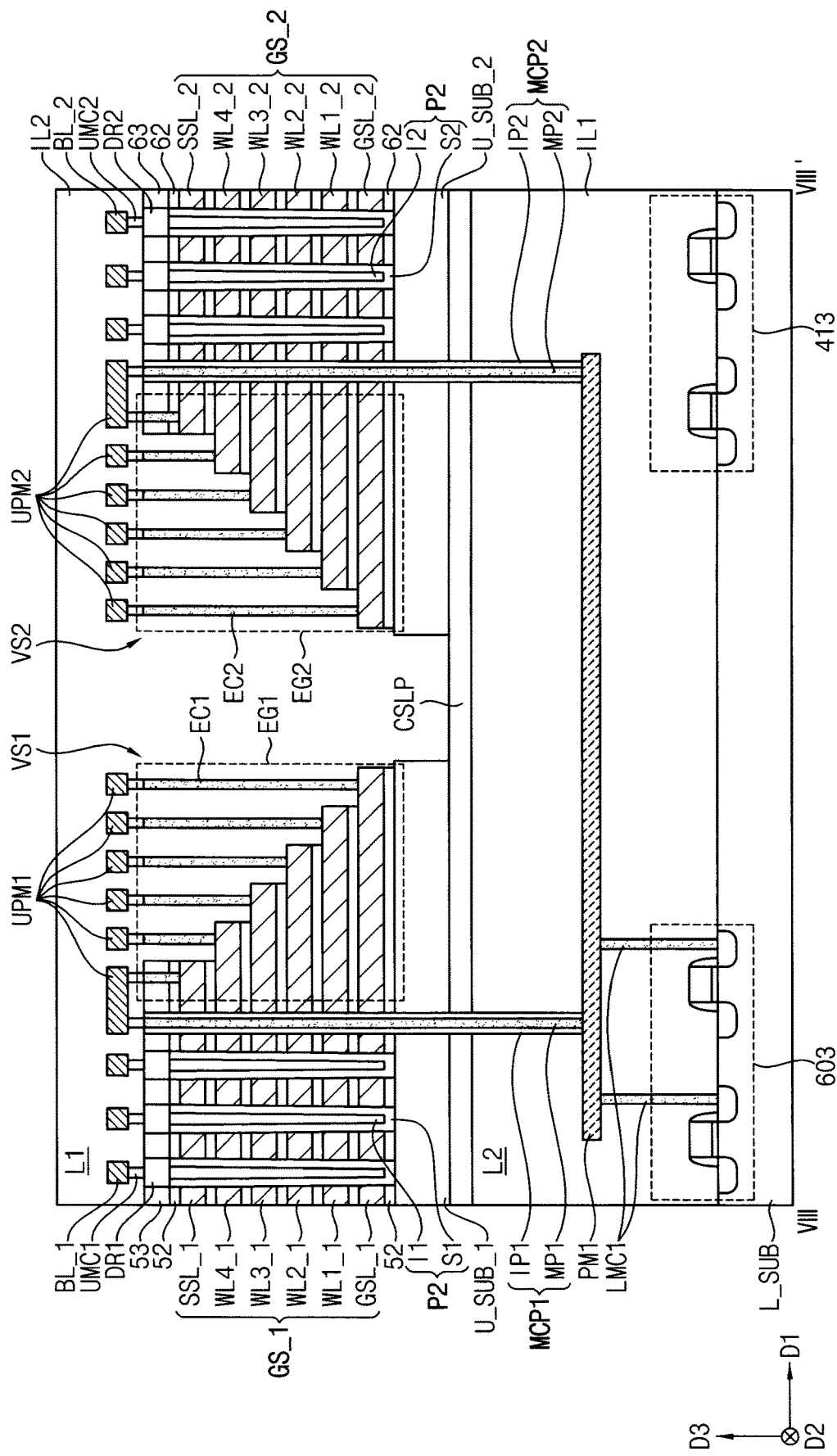
FIG. 22 is a cross-sectional view taken along line VI-VI' of FIG. 21, illustrating configurations of the first and second semiconductor layers.

FIG. 21 illustrates a nonvolatile memory device including first and second vertical structures according to exemplary embodiments and FIG. 22 is a cross-sectional view taken along line VI-VI' of FIG. 21, illustrating configurations of the first and second semiconductor layers.

Referring to FIGS. 21 and 22, a memory cell array 100a included in a nonvolatile memory device 50a is different from the memory cell array 100 in FIG. 13 in that the memory cell array 100a further includes a common source line plate CSLP. The source line plate CSLP may be interposed between the first semiconductor layer L1 and the second semiconductor layer L2.

The nonvolatile memory device 50a may further include common source line drivers 611 and 613 that drive a common source line formed in the common source line plate CSLP. The common source line driver 611 may drive a common source line of the first sub-blocks through the edge through-hole via THV12 and a signal line SG21 and the common source line driver 613 may drive a common source line of the second sub-blocks through the edge through-hole via THV22 and a signal line SG22.

Figure 23:
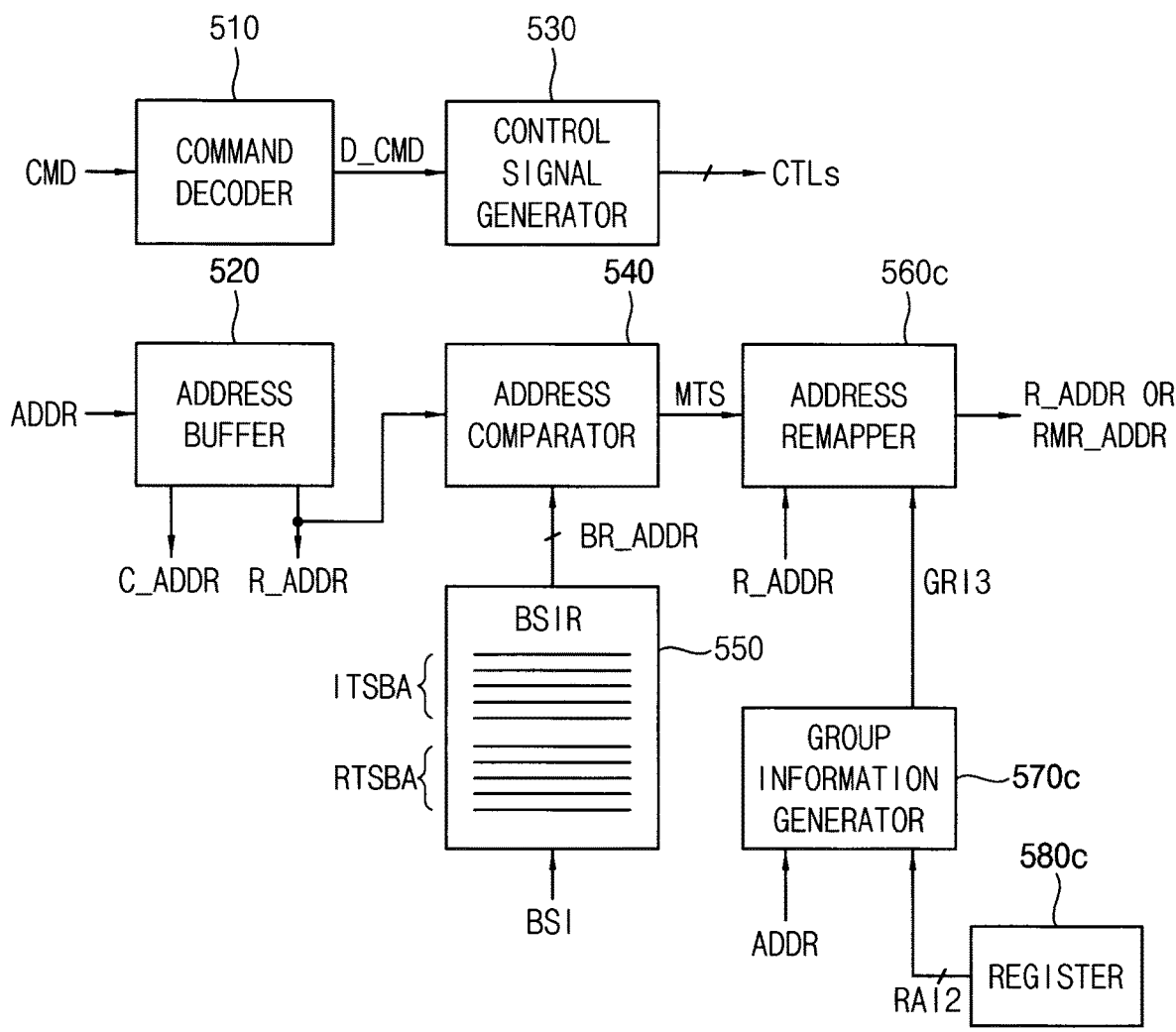
FIG. 23 is a block diagram illustrating an example of the control circuit in the nonvolatile memory device of FIG. 3 according to exemplary embodiments.
Figure 24:
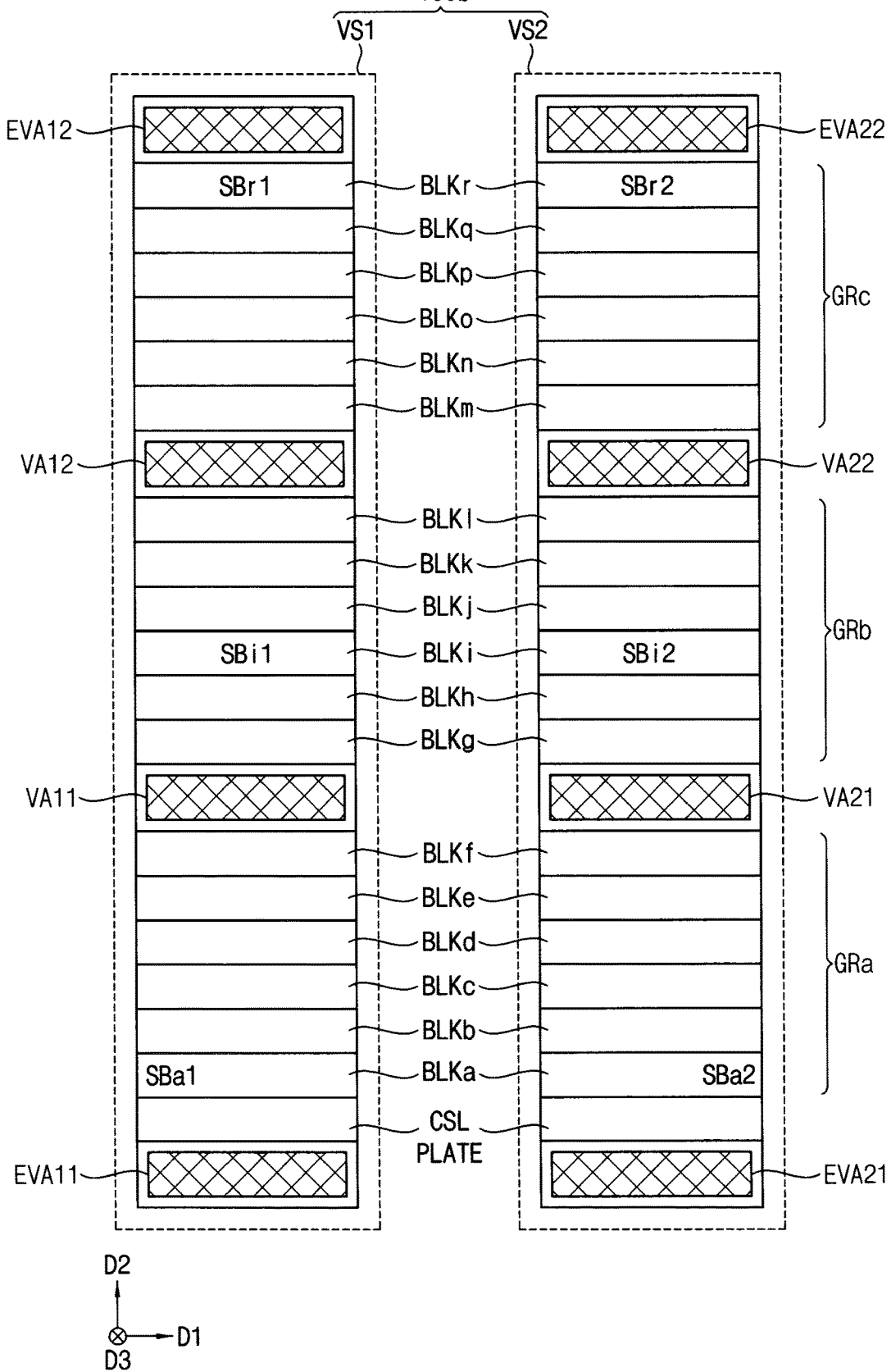
FIG. 24 illustrates an example of grouping of the memory blocks, which is performed by the control circuit of FIG. 23.

FIG. 23 is a block diagram illustrating an example of the control circuit in the nonvolatile memory device of FIG. 3 according to exemplary embodiments, and FIG. 24 illustrates an example of grouping of the memory blocks, which is performed by the control circuit of FIG. 23. This control circuit 500c may include a command decoder 510, an address buffer 520, a control signal generator 530, an address comparator 540, a bad sub-block information register 550, an address re-mapper 560c, a group information generator 570c and a register 580c.

The control circuit 500c of FIG. 23 differs from the control circuit 500a of FIG. 16 in the address re-mapper 550c, the group information generator 570c and the register 580c. The register 580c may store a reference address information RAI2 associated with a distance from each of the first via areas EVA11, VA11, VA12 and EVA12 and may provide the reference address information RAI2 to the group information generator 570c. The group information generator 570c may receive the row address R_ADDR and the reference address information RAI2, may generate a group address information GAI3 indicating a group to which a memory block accessed by the row address R_ADDR belongs to, of the plurality of groups, based on a comparison of the row address R_ADDR and the reference address information RAI2 and may provide the group address information GAI3 to the address re-mapper 560c.

For example, if the match signal MTS indicates that the row address R_ADDR does not match at least one of the bad sub-block row address BR_ADDR, the address re-mapper 560c outputs the row address R_ADDR. For example, if the match signal MTS indicates that the row address R_ADDR matches at least one of the bad sub-block row address BR_ADDR, the address re-mapper 560a outputs the re-mapped address RMR_ADDR by re-mapping the row address R_ADDR.

Referring to FIGS. 23 and 24, the control circuit 500c may groups the memory blocks BLKa~BLKr into groups GRa, GRb and GRc based on a distance from each of the first via areas EVA11, VA11, VA12 and EVA12 which serve as boundaries and may perform address re-mapping such that at least one sub-block of a second memory block in a first group is selected in response to a defect occurring in a first memory block, accessed by the row address R_ADDR, in a first group of the plurality of groups. In FIG. 24, the control circuit 500c may group the memory blocks BLKa~BLKf arranged between the via areas EVA11 and VA11 into the group GRa, may group the memory blocks BLKg~BLKl arranged between the via areas VA11 and VA12 into the group GRb, and may group the memory blocks BLKm~BLKr arranged between the via areas VA12 and EVA12 into the group GRc.

In addition, the control circuit 500c performs the address re-mapping in a selected memory block in each of the groups bottom group GRa, GRb and GRc and distance from the edge through-hole vias THV12 and THV22.

FIGS. 25A through 25E illustrate that the control circuit in FIG. 3 performs an address re-mapping. The memory cell array 100 includes a plurality of memory blocks BLK1~BLK100, and each of the memory blocks BLK1~BLK100 includes a corresponding one of first sub-blocks SB1a-SB100a and a corresponding one of second sub-blocks SB1b-SB100b. The first sub-blocks SB1a-SB100a may constitute a first tile TL1 and may be included in a first vertical structure and the second sub-blocks SB1b-SB100b may constitute a second tile TL2 and may be included in a second vertical structure. The sub-block SB1b may be an initial bad block ITBB. The control circuit 500 may group the memory blocks BLK1~BLK100 into a plurality of groups based on one of whether the memory blocks are close to a via area, a distance from the edge through-hole via and via areas.

Figure 25A:
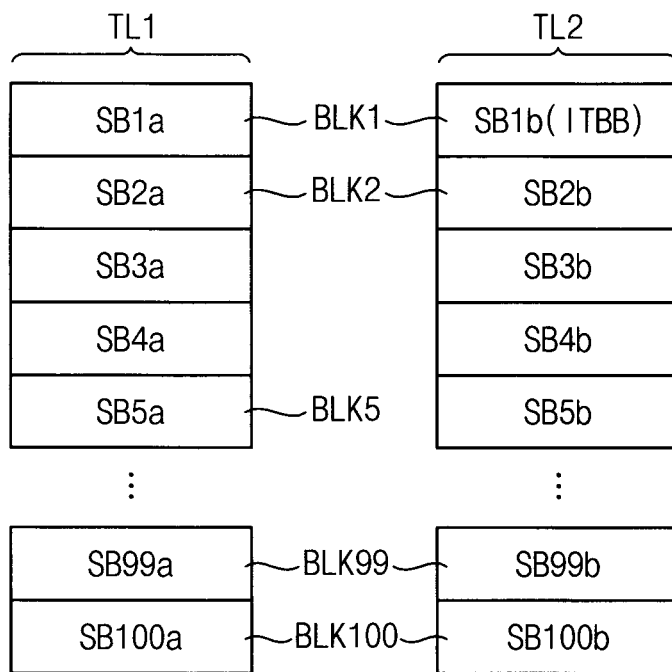
FIGS. 25A through 25E illustrate that the control circuit in FIG. 3 performs an address re-mapping according to exemplary embodiments.
Figure 25B:
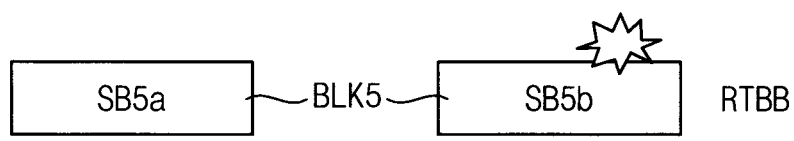
Figure 25C:
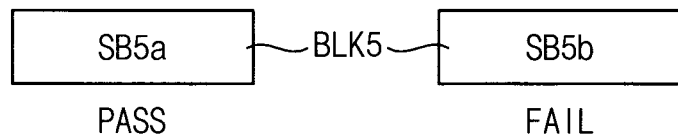

Referring to FIGS. 25B and 25C, a defect occurs in a memory block (a first memory block) BLK5 during operation of the nonvolatile memory device 50. The control circuit 500 checks whether the defect occurs in each of the sub-blocks SB5a and SB5b in the memory block BLK5 and determines that the sub-block SB5a as 'pass' and the sub-block SB5a as 'fail'. The sub-block SB5b of memory block BLK5 is represented as a run-time bad block (RTBB).

Figure 25D:
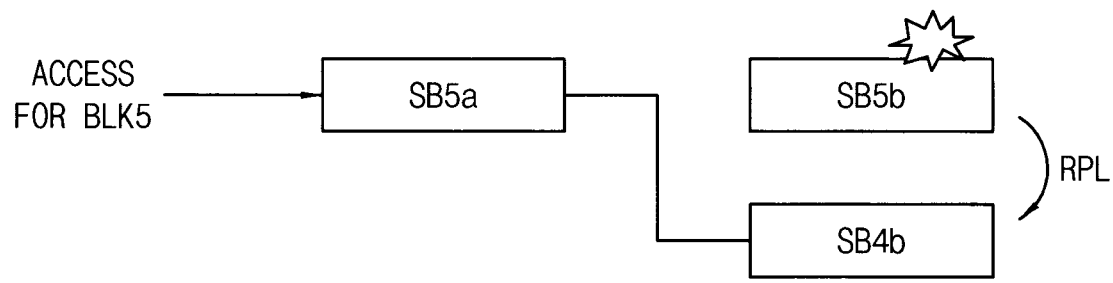

Referring to FIG. 25D, if an access to the first memory block BLK5 is requested, the control circuit 500 performs an address re-mapping such that the sub-block SB5b of the first memory block BLK5 is replaced RPL with a sub-block SB4b of a second memory block BLK4 in a group to which the first memory block BLK5 belongs to. That is, the control circuit 500 re-maps a first address to access the sub-block SB5b of the first memory block BLK5 to generate a first re-mapped address to access the sub-block SB4b of the second memory block BLK4.

Figure 25E:
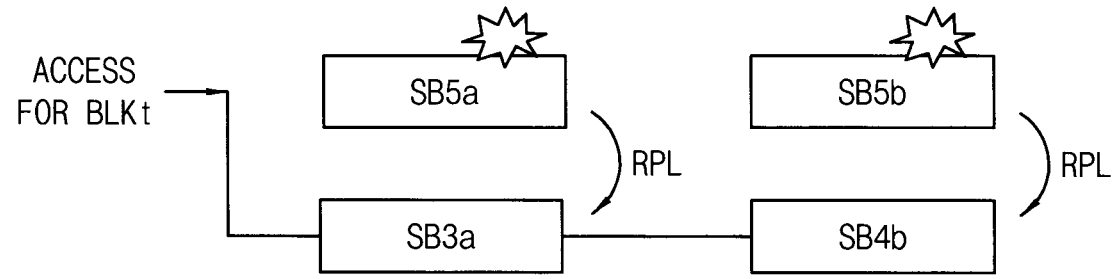

Referring to FIG. 25E, if additional defect occurs in the sub-block SB5a of the first memory block BLK5 and an access to the first memory block BLK5 is requested, the control circuit 500 performs an address re-mapping such that the sub-block SB5a of the first memory block BLK5 is replaced RPL with a sub-block SB3a of a third memory block BLK3 in a group to which the first memory block BLK5 belongs to. That is, the control circuit 500 re-maps a first address to access the sub-block SB5a of the first memory block BLK5 to generate a second re-mapped address to access the sub-block SB4c of the third memory block BLK3.

Figure 26:
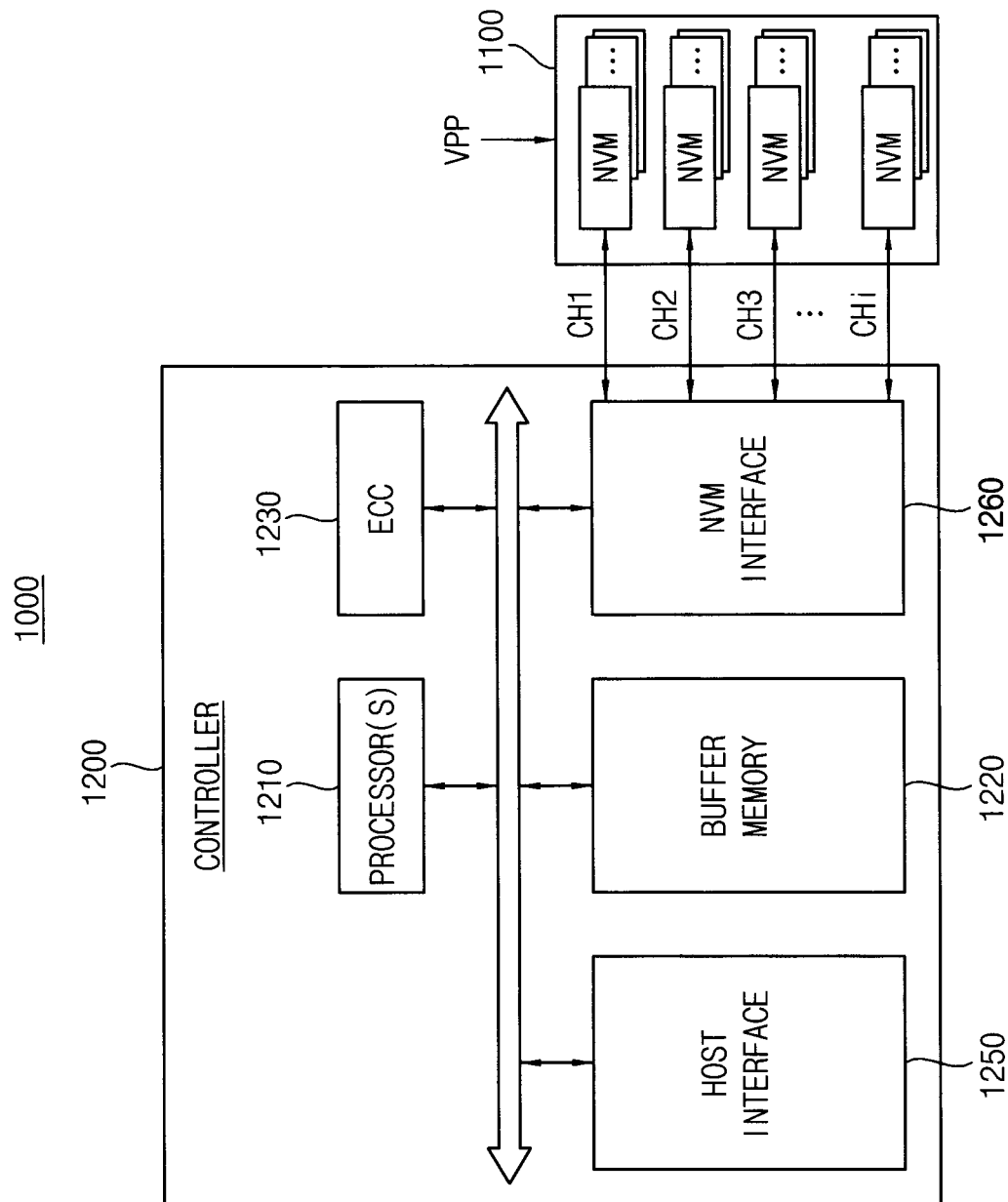
FIG. 26 is a block diagram illustrating a solid state disc or solid state drive (SSD) including nonvolatile memory devices according to exemplary embodiments.

FIG. 26 is a block diagram illustrating a solid state disc or solid state drive (SSD) including nonvolatile memory devices according to exemplary embodiments. Referring to FIG. 26, a SSD 1000 includes multiple nonvolatile memory devices 1100 and a SSD controller 1200. The SSD controller 1200 may be connected to the nonvolatile memory devices 1100 through multiple channels CH1, CH2, CH3, . . . , CHi. The SSD controller 1200 may include one or more processors 1210, a buffer memory 1220, an error correction code (ECC) circuit 1230, a host interface 1250, and a nonvolatile memory interface 1260.

The buffer memory 1220 may store data used to drive the SSD controller 1200. The buffer memory 1220 may include multiple memory lines each storing data or a command. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100. Each of the nonvolatile memory devices 1100 may be the nonvolatile memory device according to example embodiments and may be optionally supplied with an external high voltage VPP.

A nonvolatile memory device or a storage device according to exemplary embodiments may be packaged using various package types or package configurations. The present disclosure may be applied to various electronic devices including a nonvolatile memory device.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A nonvolatile memory device, comprising:
a substrate having a plurality of address decoders and a plurality of page buffer circuits therein;
a memory cell array comprising:
a first vertical structure having a plurality of first memory sub-blocks therein and a first plurality of through-hole vias extending at least partially therethrough; and
a second vertical structure having a plurality of second memory sub-blocks therein and a second plurality of through-hole vias extending at least partially therethrough; and
a control circuit configured to group the first memory sub-blocks into a plurality of first groups of memory sub-blocks such that each of the plurality of first groups of memory sub-blocks are disposed between two adjacent through-hole vias from among the first plurality of through-hole vias without any through hall vias disposed therebetween, and a defective one of the first memory sub-blocks is remapped to a non-defective one of the first memory sub-blocks, wherein the non-defective one of the first memory sub-blocks and the defective one of the first memory sub-blocks are included in the same group of memory sub-blocks among the plurality of first groups of memory sub-blocks.

2. The nonvolatile memory device of claim 1, wherein the control circuit is further configured to group the second memory sub-blocks into a plurality of second groups of memory sub-blocks such that each of the plurality of second groups of memory sub-blocks are disposed between two adjacent through-hole vias from among the second plurality of through-hole vias without any through hall vias disposed therebetween, and a defective one of the second memory sub-blocks is remapped to a non-defective one of the second memory sub-blocks, wherein the non-defective one of the second memory sub-blocks and the defective one of the second memory sub-blocks are included in the same group of memory sub-blocks from among the plurality of second groups of memory sub-blocks.

3. The nonvolatile memory device of claim 1, wherein:
the memory cell array includes a plurality of mats corresponding to different bit-lines of a plurality of bit-lines; and
each of the plurality of mats includes the first vertical structure and the second vertical structure.

4. The nonvolatile memory device of claim 1, wherein the control circuit is further configured to control the plurality of address decoders and the plurality of page buffer circuits within the substrate, in response to a command and address received by the nonvolatile memory device.

5. The nonvolatile memory device of claim 4, wherein the control circuit comprises:
a register configured to store boundary address information associated with the first plurality of through-hole vias;
a group information generator configured to generate group address information indicating a group to which the first memory sub-block associated with the address belongs to, based on the address and the boundary address information; and an address re-mapper configured to generate a first re-mapped address to access the non-defective one of the first memory sub-blocks by re-mapping an address associated with the defective one of the first memory sub-blocks, based on the group address information.

6. The nonvolatile memory device of claim 4, wherein the first and second vertical structures having a plurality of bit lines thereon and a plurality of word lines therein; wherein at least some of the first plurality of through-hole vias electrically connect at least some of the bit lines to portions of the plurality of page buffer circuits; and wherein at least some of the first plurality of through-hole vias electrically connect at least some of the word lines to portions of the plurality of address decoders.

7. A nonvolatile memory device, comprising:
a memory cell region including a memory cell array therein, which comprises a first vertical structure and a second vertical structure, the first vertical structure including a plurality of first memory sub-blocks therein, and a first plurality of through-hole vias extending at least partially therethrough, the second vertical structure including a plurality of second memory sub-blocks therein, and a second plurality of through-hole vias extending at least partially therethrough; and a control circuit configured to group the first memory sub-blocks into a plurality of first groups of memory sub-blocks such that each of the plurality of first groups of memory sub-blocks are disposed between two adjacent through-hole vias from among the first plurality of through-hole vias without any through hole vias disposed therebetween, and a defective one of the first memory sub-blocks is remapped to a non-defective one of the first memory sub-blocks, wherein the non-defective one of the first memory sub-blocks and the defective one of the first memory sub-blocks are included in the same group of memory sub-blocks among the plurality of first groups of memory sub-blocks.

8. The nonvolatile memory device of claim 7, wherein the control circuit is further configured to group the second memory sub-blocks into a plurality of second groups of memory sub-blocks such that each of the plurality of second groups of memory sub-blocks are disposed between two adjacent through-hole vias from among the second plurality of through-hole vias without any through hole vias disposed therebetween, and a defective one of the second memory sub-blocks is remapped to a non-defective one of the second memory sub-blocks, wherein the non-defective one of the second memory sub-blocks and the defective one of the second memory sub-blocks are included in the same group of memory sub-blocks among the plurality of second groups of memory sub-blocks.

9. The nonvolatile memory device of claim 7, further comprising a peripheral circuit region under the memory cell region, the peripheral circuit region having a plurality of address decoders and a plurality of page buffer circuits therein; and wherein an interface between the peripheral circuit region and the memory cell region extends between the plurality of address decoders and the plurality of page buffer circuits and the memory cell array.

10. The nonvolatile memory device of claim 7, wherein:
the memory cell array includes a plurality of mats corresponding to different bit-lines of a plurality of bit-lines; and
each of the plurality of mats includes the first vertical structure and the second vertical structure.

11. The nonvolatile memory device of claim 7, wherein the memory cell region further comprises:
a plurality of word-lines extending in a first direction; and
a plurality of bit-lines extending in a second direction crossing the first direction.

12. A nonvolatile memory device comprising:
a memory cell region including a plurality of word-lines extending in a first direction, a plurality of bit-lines extending in a second direction and a memory cell array therein, wherein the memory cell array includes a first vertical structure and a second vertical structure adjacent to each other in the first direction, wherein the first vertical structure includes a plurality of first memory sub-blocks and a first plurality of through-hole vias extending at least partially therethrough and the second vertical structure includes a plurality of second memory sub-blocks corresponding to the first memory sub-blocks and a second plurality of through-hole vias extending at least partially therethrough;

a peripheral circuit region under the memory cell region, wherein the peripheral circuit region includes a lower substrate that includes a plurality of address decoders and a plurality of page buffer circuits which control the memory cell array; and a control circuit configured to group the first memory sub-blocks into a plurality of first groups of memory sub-blocks such that each of the plurality of first groups of memory sub-blocks are disposed between two adjacent through-hole vias from among the first plurality of through-hole vias without any through hole vias disposed therebetween, and a defective one of the first memory sub-blocks is remapped to a non-defective one of the first memory sub-blocks, wherein the non-defective one of the first memory sub-blocks and the defective one of the first memory sub-blocks are included in the same group of memory sub-blocks among the plurality of first groups of memory sub-blocks.

13. The nonvolatile memory device of claim 12, wherein the control circuit is further configured to group the second memory sub-blocks into a plurality of second groups of memory sub-blocks such that each of the plurality of second groups of memory sub-blocks are disposed between two adjacent through-hole vias from among the second plurality of through-hole vias without any through hall vias disposed therebetween, and a defective one of the second memory sub-blocks is remapped to a non-defective one of the second memory sub-blocks, wherein the non-defective one of the second memory sub-blocks and the defective one of the second memory sub-blocks are included in the same group of memory sub-blocks among the plurality of second groups of memory sub-blocks.

14. The nonvolatile memory device of claim 12, wherein:
the memory cell array includes a plurality of mats corresponding to different bit-lines of the plurality of bit-lines; and
each of the plurality of mats includes the first vertical structure and the second vertical structure.

15. The nonvolatile memory device of claim 12, wherein the control circuit is further configured to control the plurality of address decoders and the plurality of page buffer circuits within the lower substrate, in response to a command and address received by the nonvolatile memory device.

16. The nonvolatile memory device of claim 12, wherein at least a first portion of the first and second plurality of through-hole vias connect at least some portion of the bit-lines to at least some portion of the plurality of page buffer circuits, and wherein at least a second portion of the first and second plurality of through-hole vias connect at least some portion of the word-lines to at least some portion of the plurality of address decoders.

* * * * *